United States Patent
Miyauchi

(10) Patent No.: US 6,861,833 B2
(45) Date of Patent: Mar. 1, 2005

(54) FREQUENCY CONVERSION SWEEP MEASURING METHOD

(75) Inventor: Kouji Miyauchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/398,153

(22) PCT Filed: Oct. 1, 2001

(86) PCT No.: PCT/JP01/08622

§ 371 (c)(1),
(2), (4) Date: Apr. 1, 2003

(87) PCT Pub. No.: WO02/29426

PCT Pub. Date: Apr. 11, 2002

(65) Prior Publication Data

US 2004/0041554 A1 Mar. 4, 2004

(30) Foreign Application Priority Data

Oct. 2, 2000 (JP) ........................................ 2000-306624

(51) Int. Cl.⁷ ............................................. G01R 23/00
(52) U.S. Cl. .................................. 324/76.19; 324/76.23
(58) Field of Search ........................... 324/76.19, 76.23, 324/76.29, 76.61; 331/178; 702/76, 75

(56) References Cited

U.S. PATENT DOCUMENTS

| | | | |
|---|---|---|---|
| 4,791,577 A | * 12/1988 | Winter | 702/77 |
| 5,300,878 A | * 4/1994 | Wardle et al. | 324/76.27 |
| 5,736,845 A | 4/1998 | Kosuge | 324/76.27 |
| 6,166,533 A | 12/2000 | Musha | 324/76.27 |
| 6,265,861 B1 | * 7/2001 | Musha | 324/76.23 |
| 6,275,020 B1 | * 8/2001 | Nagano | 324/76.27 |
| 6,392,397 B1 | * 5/2002 | Thomas | 324/76.11 |
| 6,504,354 B1 | * 1/2003 | Waida | 324/76.39 |

FOREIGN PATENT DOCUMENTS

JP          9252261          9/1997

* cited by examiner

Primary Examiner—N. Le
Assistant Examiner—Walter Besnon
(74) Attorney, Agent, or Firm—David N. Lathrop, Esq.; Gallagher & Lathrop

(57) ABSTRACT

A preselector is omitted in a spectrum analyzer, for example, which is used to prevent an image signal from being inputted. In addition, an image signal of a signal which is located outside a range of set-up measured frequencies is suppressed as much as possible. For a range of set-up measured frequencies F1~F2, and for each of a plurality of intermediate frequencies $F_i$, the frequency of the sweep signal is swept over a range $F1+F_i \sim F2+F_i$ to determine first measured data, and is also swept over a range $F1-F_i \sim F2-F_i$ to determine second measured data. The first and the second measured data are compared against each other for each measured frequency point, and if they are equal, the data value obtained or a data value having a minimum value unless they are not of an equal value is delivered to obtain measured data in which image data based on image signals has been suppressed.

11 Claims, 20 Drawing Sheets

| | |
|---|---|
| F1 + Fi | D11 |
| F1 - Fi | D21 |
| F1 + Fi + Δf | D12 |
| F1 - Fi + Δf | D22 |
| F1 + Fi + 2Δf | D13 |
| F1 - Fi + 2Δf | D23 |
| ⋮ | ⋮ |
| F2 + Fi | D1w |
| F2 - Fi | D2w |

FREQUENCY CONVERSION SWEEP MEASURING METHOD

TECHNICAL FIELD

The present invention relates to a method of measurement for an apparatus such as a spectrum analyzer, a spurious signal measuring unit or the like including a mixer where a signal being measured is converted into an intermediate frequency signal with a frequency sweep signal for purpose of measurement, or a method of measurement by sweeping frequency conversion, and in particular, to an image response (image signal) suppression method.

BACKGROUND ART

The prior art for this kind of frequency sweep measuring unit will be described hereinbelow with reference to a spectrum analyzer as an example in order to elucidate issues.

FIG. 1 shows the principle and construction of a conventional spectrum analyzer, and FIG. 2 shows a specific example of construction of an IF assembly 50 shown in FIG. 1.

The spectrum analyzer shown in FIG. 1 comprises three channels of frequency converters, and a range of frequencies which are to be measured is divided into three bands including a low band Flow, a high band Fhi and a super-high band RFin, as shown in FIG. 3. In terms of specific figures, the low band Flow ranges from 0.1 MHz~3.6 GHz, the high band Fhi ranges from 3.6 GHz~8 GHz, and the super-high band RFin ranges from 8 GHz and higher.

A signal being measured in the low band Flow and in the high band Fhi of 0.1 MHz~8 GHz which is input from a first input terminal T1 is attenuated to a given range of levels in an input attenuator 10, and subsequently a change-over switch SW1 is changed to feed it through a low pass filter 12 to a mixer 14 during the measurement of the low band Flow and to feed it through a variable tuning filter 16 to a mixer 18 during the measurement of the high band Fhi.

When the signal being measured is in the low band Flow of 0.1 MHz~3.6 GHz, an output from the mixer 14 is passed through a band-pass filter BPF 24 to be fed to a mixer 28 where it is converted into an intermediate frequency signal having an intermediate frequency Fi by a local signal from a fixed oscillator 26. Specifically, after frequency components of the signal being measured which are equal to or below 3.6 GHz are passed through and delivered from the low pass filter 12 which comprises a preselector, they are subject to an up-conversion in the mixer 14 by a frequency sweep signal from a frequency sweep oscillator 20. Assuming that an output frequency from the mixer 14 is 4.2 GHz, a sweep frequency Flo of the sweep oscillator 20 sweeps frequencies 4.2 GHz~7.8 GHz. The band-pass filter 24 only passes 4.2 GHz component. When the local signal from the fixed oscillator 26 has a frequency of 3.8 GHz, there is obtained a signal having an intermediate frequency of 0.4 GHz from the mixer 28. This intermediate frequency signal is fed through a change-over switch SW3 to an IF assembly 50.

When the signal being measured is in the high band Fhi of 3.6 GHz~8 GHz, an output from the YIG variable tuning filter 16 is subject to a frequency mixing with a sweep signal from the sweep oscillator 20 in the mixer 18, and an output from the mixer 18 is passed through a low pass filter 30 to derive a component having an intermediate frequency of 0.4 GHz. Thus, the sweep frequency Flo of the sweep oscillator 20 sweeps frequencies in 4.0 GHz~8.4 GHz. In interlocked relationship with the sweep, the tuning frequency of the variable tuning filter 16 is varied in order to feed only a frequency component of the signal being measured which is to be measured to the mixer 18, and only a component of the output signal from the mixer which has an intermediate frequency Fi of 0.4 GHz is passed through the low pass filter 30, and then fed to the IF assembly 50 by the change-over switch SW3.

The YIG variable tuning filter 16 comprises a preselector which uses YIG (Yttrium Iron Garnet), and allows only a frequency component to be measured which corresponds to the sweep frequency Flo to be passed therethrough by changing an exciting magnetic field applied to YIG so that the passed frequency tracks the sweep frequency Flo of the sweep oscillator. The YIG variable o tuning filter 16 has a power demand of several tens of watts in order to apply a desired exciting magnetic field and for other purposes. The YIG variable tuning filter 16 has a good filtering response, but is expensive and bulky.

Finally, when the signal being measured is a signal in the super-high band RFin equal to or above 8 GHz, an external mixer 200 is provided outside a casing 300 of the spectral analyzer, and an N-th harmonic wave of the sweep signal from the sweep oscillator 20 is utilized in the frequency conversion of the signal being measured. Specifically, the sweep signal as branched by a coupler 22 is fed to a buffer amplifier 32, whereby harmonics inclusive of the fundamental wave of the sweep signal is fed through a coupling capacitor 34 to the external mixer 200 as a local signal L0. In this manner, if harmonics are used up to N=7, for example, it is possible to measure frequencies as high as 50 GHz and above.

On the other hand, the signal being measured in the super-high band RFin which is input from an input terminal T3 is fed to the external mixer 200 through an external band-pass filter 202 not shown. The external band-pass filter 202 comprises a preselector, and is a fixed-mode band-pass filter having a filtering frequency response which corresponds to the measured frequency band in the super-high band RFin.

Because the super-high band RFin is very broad, each time when a measured frequency band is changed within the super-high band, there arises a need to change the external filter 202 to one which corresponds to the measured frequency band in the super-high band RFin. In other words, it is necessary that external filters 202 be provided each having a pass frequency which corresponds to each frequency band within the super-high band RFin. By way of example, if pass frequency bands are delineated in unit of 0.4 GHz and if 8 GHz~50 GHz are subject to the measurement, there must be provided as many external filters 202 as (50 GHz~8 GHz)/0.4 GHz=105. It is impractical to provide so many external filters 202.

There is an instance that a YIG tuning filter (YTF) which comprises a variable tuning filter is used in place of the fixed-mode external BPF 202, and a control signal is fed to cause the YIG tuning filter 204 to be tuned to the frequency of an N-th harmonic of the sweep signal which acts as a local signal. With such an arrangement, it is possible to establish each desired pass frequency band using a single variable tuning filter 204. However, it is to be noted that such YIG tuning filter 204 itself represents a very expensive component, and may cost as much as comparable to the apparatus proper.

The external mixer 200 is put to use when it is connected to an input terminal T2 on the casing 300 by a user. The signal being measured which is in the super-high band RFin is subject to a down conversion in the external mixer 200 by means of the N-th harmonic wave of the sweep signal to provide an intermediate frequency signal IF of 0.4 GHz, which is delivered to the input terminal T2, and a high suppress choke filter 36 allows only a low band component 36s including the intermediate frequency $F_i$ to be passed therethrough to be fed to the IF assembly 50 through the change-over switch SW3.

A sweep controller 100 controls the sweep oscillator 20 so as to perform a frequency sweep across a frequency span which corresponds to the frequency converter in one of three channels including the channel using the mixer 14, the channel using the mixer 18 and the channel using external mixer 200 and which is selected by the user. A portion of the sweep controller 100 which undertakes the high band Fhi of 3.6 GHz~8 GHz performs a tracking control of the tuning frequency of the YIG variable tuning filter 16 in interlocked relationship with the frequency sweep of the sweep signal. Where the YIG variable tuning filter 204 is used, this YIG variable tuning filter 204 is similarly subject to a tracking control.

The IF assembly 50 includes a variable bandwidth filter which allows only frequency components of the input intermediate frequency signal which are in a desired bandwidth to pass therethrough, and subsequently converts it into given digital data, which is then stored in a buffer memory for each sweep. An example of its internal construction will be described below with reference to FIG. 2.

An intermediate frequency signal from one of the frequency converters in the three channels is input, amplified in a variable gain amplifier 51 to be fed to a band-pass filter 55 where only components having an intermediate frequency $F_i$ of 0.4 GHz are allowed to pass, and the passed output is subject to a down conversion to a lower intermediate frequency Fi2, for example, 20 MHz, in a mixer 56 by means of a local signal from a fixed oscillator 57. The lower intermediate frequency signal is band limited with a desired resolution bandwidth by an intermediate frequency filter 52 which can be set up to any bandwidth response. The band limited intermediate frequency signal is applied to a logarithmic converter 58 where its amplitude is converted into a logarithmic value. A corresponding converted output is detected by a detector 53 and the detected output is quantized into digital data in an AD converter 54, and the resulting digital data is continuously stored in a buffer memory 59 in unit of one sweep.

Returning to the description of FIG. 1, the spectrum data in unit of one sweep which is acquired in the IF assembly 50 is supplied to a display 90, thus displaying the spectrum of the signal being measured and else. The IF assembly 50, the display 90, the sweep controller 100, switches SW1, SW2, SW3 are controlled by an apparatus controller 110. When the center frequency and the frequency span for the signal which is desired to be measured is set up in the apparatus controller 110, the apparatus controller 110 controls various parts in accordance with the values set up.

As described above, a conventional spectrum analyzer has three channels of frequency converters, and in each channel of the frequency converter, there is provided a preselector separately in order to avoid a wrong measurement which may be caused by an image signal and which results from a frequency component which is spaced from the signal of the intended frequency by twice the intermediate frequency. For this reason, there has been a need to provide a number of components including a plurality of mixer components, change-over switches SW1, SW2, SW3 and the like. In particular, for the measurement of the super-high band RFin, a number of band-pass filters 202 or an expensive YIT variable tuning filter 204 has been used. This resulted in a high cost.

In addition, a high frequency circuit requires a mounting structure having shielded spaces created by metal shield constructions as may be formed by aluminum die castings, for example, between various circuit function blocks in order to prevent interferences between adjacent circuits from occurring. However, with three channels of frequency converters, there exist a number of circuit blocks, thus requiring a number of shielded spaces. As a consequence, the cost of the apparatus increases in proportion to the circuit blocks and the circuit elements. The provision of a number of shielded spaces result in a casing of an increased size, rendering it difficult to reduce the size and the weight.

A technology which overcomes such problems is proposed in Japanese Laid-Open Patent Application No. 233, 875/96 (or counterpart U.S. Pat. No. 5,736,845, issued Apr. 7, 1998). This is illustrated in FIG. 4 where a signal being measured from an input terminal T3 is fed to an external mixer 200 without passing it through a preselector, and a sweep signal which represents an N-th harmonic wave of a sweep oscillator 20 is used to convert the signal being measured into an intermediate frequency Fi in the external mixer 200, and the converted signal is fed to an IF assembly 50 through a terminal T4 and a switch SW3. The IF assembly 50 feeds measured data to an image eliminator 70 which eliminates data which is based on an image signal before the data is fed to a display 90.

The elimination of image data will be described in terms of specific values. It is assumed that an intermediate frequency $F_i$=0.4 GHz and that a signal being measured is a single 30 GHz signal. It is also assumed that the sweep frequency of the oscillator 20 is $f_{osc}$=4~8 GHz and that the measurement takes place with N=5.

First of all, the discrimination of an image signal will be described. Denoting the frequency of a signal being measured by $f_s$, when the intermediate frequency $F_i$ is produced, there are produced two components having an absolute value of $F_i$=400 MHz=$f_s \pm (f_{osc} \times N)$. When the sweep takes place using a normal sweep frequency $f_{osc}$ and another sweep frequency $f_{osc}+2F_i$ which is shifted by twice the intermediate frequency $F_i$, the resulting signal components will be such that detected points (points representing measured frequencies) which result from the both sweeps will coincide in position only for the intended signal $f_s$. The signal data and the image data are discriminated from each other by utilizing the coincidence of the detected points. Specifically, when the two sweep frequencies mentioned above are used with the sweep frequency $f_{osc}$ and the execution of the sweep is controlled in an alternate fashion, signals FN5a, FN5b are produced from the sweep with $f_{osc}$, as shown in FIG. 5(A), and signals FN5c, FN5d shown in FIG. 5B are produced from the sweep with $f_{osc}+2F_i$. Denoting the first sweep frequency by $f_{osc}1$ and choosing the second sweep frequency such that $f_{osc}2=f_{osc}1+(2F_i/5)$, it follows that a fifth harmonic wave has frequencies of $5 \times f_{osc}1$ and $5 \times f_{osc}1+2F_i$, with consequence that the second sweep frequency $f_{osc}2$ sweeps with a shift just equal to the intermediate frequency $2F_i$. As a consequence, the spectrum position resulting from the second sweep frequency $f_{osc}2$ appears at the position of FN5c, FN5d relative to the spectrum signals FN5a, FN5b which result from the first sweep, namely, with a shift of $2F_i$ to the left (at the lower measured frequencies). Since the spacing between FN5a and FN5$b$ and the spacing between FN5$c$ and FN5$d$ are equal to 2F$_i$, it exists at the position where FN5$a$ and FN5$d$ overlap each other, or at a same measured frequency point 30 GHz.

An image eliminator 70 eliminates an image by comparing data for each measured frequency point in a train of spectrum data (measured data) which are obtained from the alternate sweeps, and delivering data having a smaller value to the display 90. When this processing is applied to the four signals FN5$a$, FN5$b$, FN5$c$ and FN5$d$ mentioned above, the result will be as illustrated in FIG. 5C where it will be noted that only the signals FN5$a$ arid FN5$d$ which exist at an overlapping position is delivered as a single spectrum. Similarly, spectrum data (measured data) which are produced by N=4-th, 6-th and 7-th harmonic waves of the sweep frequencies of $f_{osc}1$ and $f_{osc}2=f_{osc}1+(2F_i/5)$ have a shift frequency of 4×(2F$_i$/5) or 6×(2F$_i$/5) or 7×(2F$_i$/5). It will be seen from the positional relationship of shifting by the intermediate frequency F$_i$×2 that four data items all assume offset positions (measured frequency points), as shown in FIGS. 5D, E and F, respectively, and accordingly they are eliminated by the image eliminator 70. As a consequence, there is obtained a spectrum indication shown in FIG. 5C, meaning that only the intended signal is obtained as a spectrum.

With the prior art mentioned above, two sweeping measurements are performed while shifting the sweep frequency by 2F$_i$, and an image eliminating processing is applied to the both spectrum data (measured data), thus allowing the expensive external band-pass filter 202 or variable YIG tuning filter 204 shown in FIG. 1 to be omitted.

However, a correct measurement is only possible under the condition that a signal being measured which is input as well as a spurious signal which is generated within the measuring apparatus do not appear at an image frequency point or at FN5$a$, FN5$c$ as considered in FIG. 5, during the frequency sweep.

This point will be discussed with reference to FIG. 6. In order to facilitate an understanding, it is assumed that a center frequency fc is located at 5 GHz, a frequency span F$_s$ is equal to 2 GHz or a spectrum measuring interval (a range of set-up frequencies) ranges F1=4 GHz~F2=6 GHz, and an input signal S2 of 6.6 GHz which exists outside the range of set-up measured frequencies 4 GHz~6 GHz is input (see FIG. 6A).

In N--mode sweep, a sweep frequency f$_L$ which acts as a local signal for the mixer 200 during the first sweep ranges from F1+F$_i$=4.4 GHz~F2+F$_i$=6.4 GHz. As a result of the sweep, in addition to spectrum data S1$b$ and S1$a$ of the input signal S1 which are obtained at two sweep frequencies of 4.6 GHz and 5.4 GHz, measured data S2 is obtained. It will be seen that data S1$b$ at 4.6 GHz is obtained from 5 GHz(=Fin)−4.6 GHz(f$_L$)=0.4 GHz and the measured frequency f$_m$ is equal to 4.2 GHz, which is lower than the frequency 5 MHz of the input signal S1 by an amount which is equal to twice the intermediate frequency F$_i$=0.4 GHz or 0.8 GHz, and represents image data of the input signal S1. Data S1$a$ is based on 5.4 GHz(=f$_L$)−5 GHz(Fin)=0.4 GHz or is based on a correct input signal S1 of 5 GHz.

S2$a$ results from 6.6 GHz(=f$_s$)−6.2 GHz(=f$_L$)=0.4 GHz, and appears at a measured frequency point of 5.8 GHz. In other words, an image of the input signal S2 has appeared as data S2$a$. In the second sweep, the sweep frequency f$_L$ ranges F1−F$_i$=3.6 GHz~F2−F$_i$=5.6 GHz, as shown in FIG. 6C, and as a result of this sweep, spectrum data S1$c$, S1$d$ of the first input signal S1 are obtained at two locations of the sweep frequency of 4.6 GHz and 5.4 GHz. It will be seen that data S1$c$ at 4.6 GHz results from 5 GHz(=Fin)−4.6 GHz(=f$_L$)=0.4 GHz or is based on the input signal S1 of 5 GHz while data S1$d$ at 5.4 GHz results from 5.4 GHz(=f$_L$)−5 GHz(=Fin)=0.4 GHz, and its measured frequency f$_m$ will be equal to 5.8 GHz which is higher than the frequency 5 GHz of the input signal S1 by an amount equal to twice F$_i$=0.4 GHz, representing image data of the input signal S1.

Accordingly, when the image eliminating processing mentioned above is applied to the first measured data (FIG. 6B) and the second measured data (FIG. 6C), it follows that at the measured frequency point of 5.8 GHz, a smaller one of data S2$a$ and S1$d$, or data S2$a$ is elected, and a consequence of the image eliminating processing becomes as shown in FIG. 6D where it will be noted that image data S2$a$ of the input signal S2 which is located outside the range of set-up measured frequencies 4~6 GHz remains unremoved.

Above problems are not limited to a spectrum analyzer, but also applies to a spurious measuring apparatus or any other frequency conversion sweeping measuring apparatus in which a signal being measured is frequency converted in a mixer using a frequency sweep signal for purpose of measurement.

It is an object of the present invention to provide a method of measurement by sweeping frequency conversion which enables a correct measurement without the provision of a preselector while avoiding an influence of image signals if measured data for a plurality of signals occur at a same measured frequency point.

DISCLOSURE OF THE INVENTION

In a method of measurement in which a signal being measured is converted in a mixer into an intermediate frequency signal having an intermediate frequency F$_i$ by means of a frequency sweep signal for purpose of measurement;

according to one aspect of the present invention, M intermediate frequencies F$_i$ are employed (where M is an integer equal to or greater than 2) and for each intermediate frequency F$_i$, a sweep signal having a frequency which is equal to a frequency in a range of set-up frequencies added with F$_i$ is used to obtain the first measured data, a sweep signal having a frequency which is equal to a frequency in the range of set-up frequencies from which F$_i$ is subtracted is used to obtain the second measured data, and an image eliminating processing may take place collectively by obtaining an equal data value and a minimum data value for each measured frequency point among 2M measured data obtained. Alternatively, for each sweeping measurement, the image eliminating processing may be applied to the measured data obtained and a result of an immediately preceding image eliminating process or a same data value and a smaller data value may be obtained for each measured frequency point. As a further alternative, the first measured data and the second measured data are obtained for each intermediate frequency, the image eliminating processing is applied to such measured data, and subsequently the image eliminating processing may be applied to a result of the image eliminating processing which is applied to each intermediate frequency.

According to another aspect of the present invention, a sweep signal is swept between a frequency which is equal to a lower limit frequency of a range of set-up frequencies from which F$_i$ is subtracted and a frequency which is equal to an upper limit frequency added with F$_i$ for each intermediate frequency $F_i$ to obtain measured data, first measured data which result from shifting the measured data in a lower direction by $F_i$ and second measured data which result from shifting the measured data in a higher direction by $F_i$ are obtained and an image eliminating processing is applied to the first and the second measured data.

BEST MODES OF CARRYING OUT THE INVENTION

First Embodiment

Figure 1:
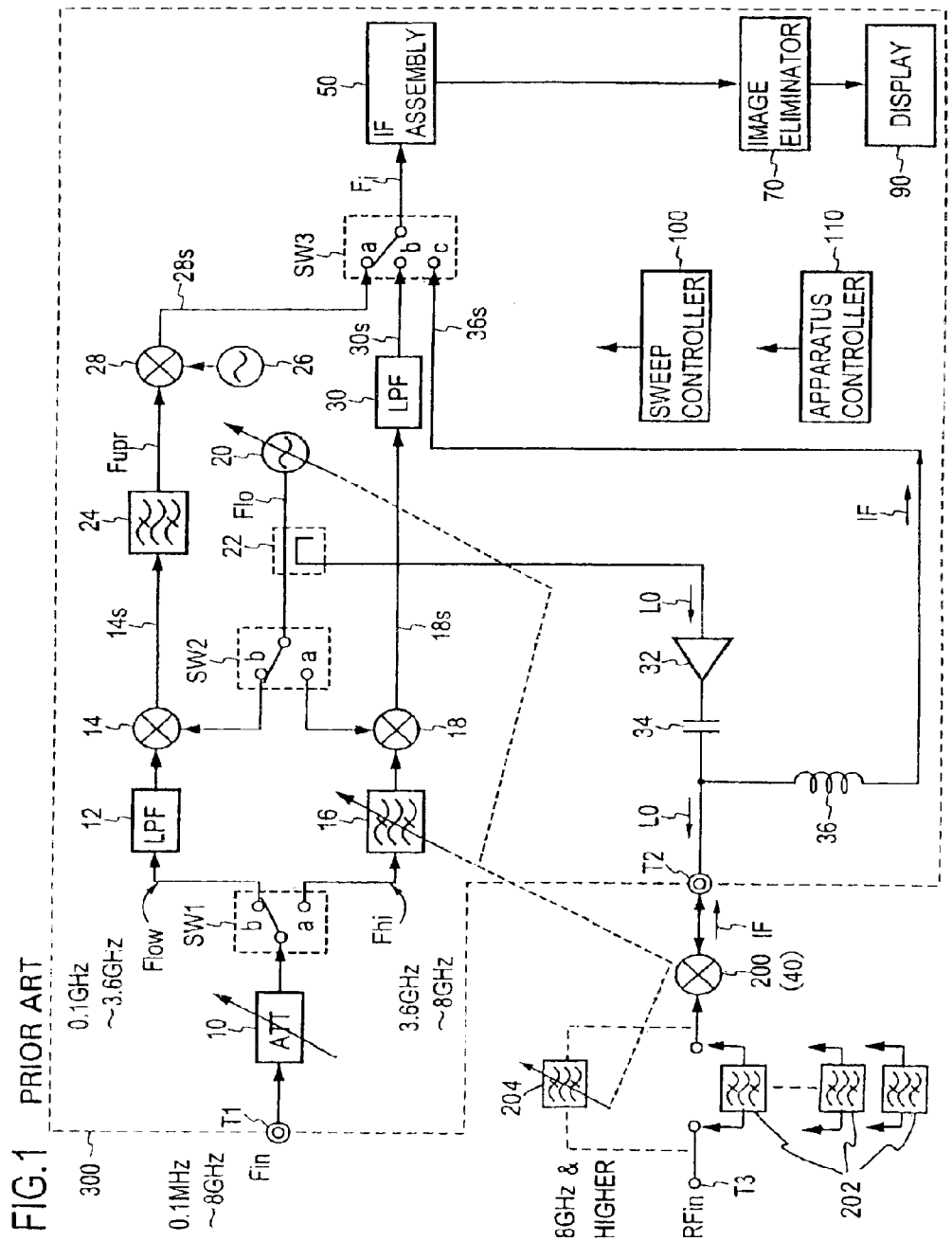
FIG. 1 is a diagram illustrating an arrangement which shows the principle of a conventional spectrum analyzer.
Figure 7:
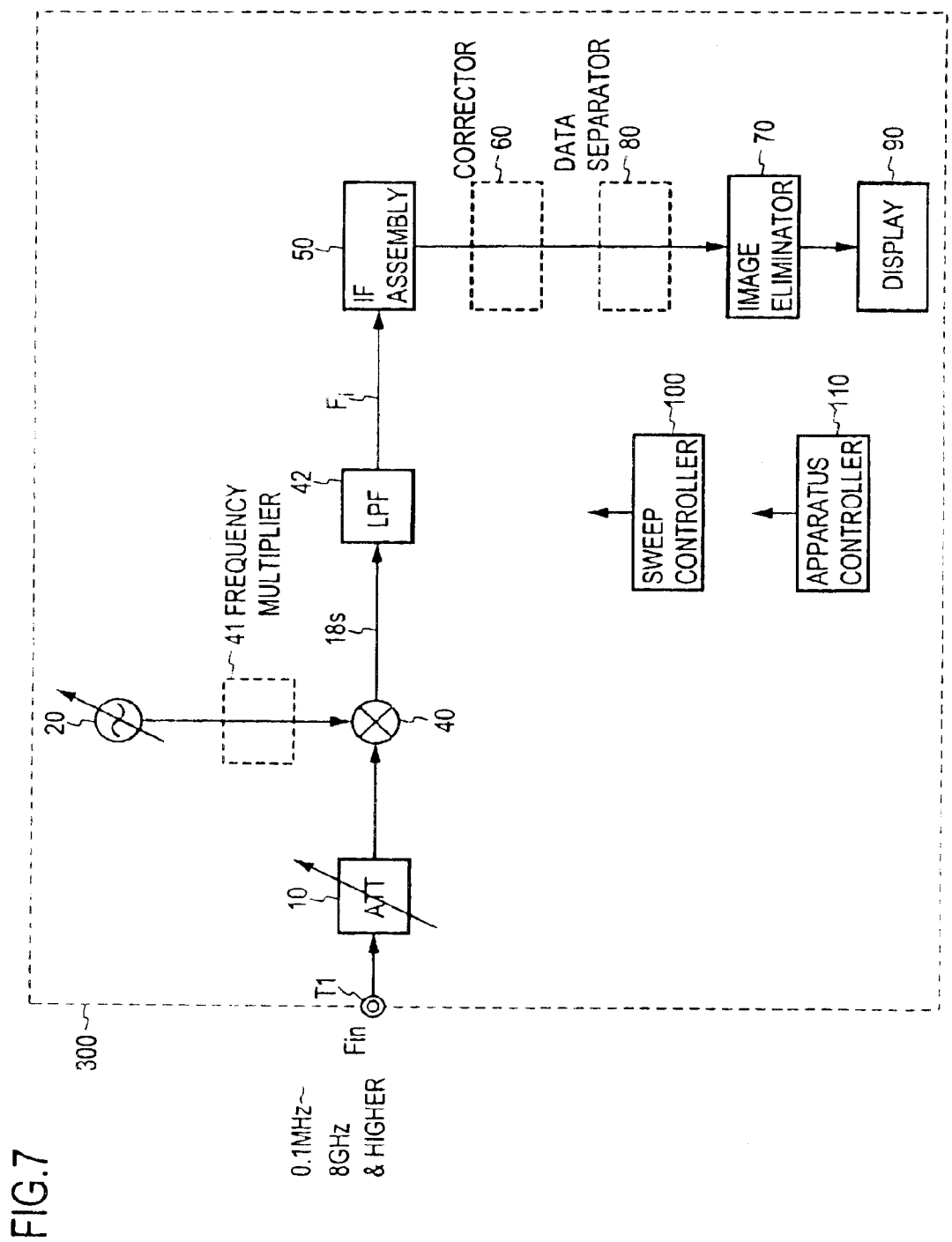
FIG. 7 is a diagram showing an exemplary functional arrangement of a spectrum analyzer to which a first embodiment of the present invention is applied.

The application of an embodiment of the present invention to a spectrum analyzer will be described. FIG. 7 shows an embodiment of a spectrum analyzer in which the present invention is applied, and corresponding parts to those shown in FIG. 1 are designated by like reference characters as used before.

A signal being measured is fed from an input terminal T1 through a variable attenuator 10 which renders it to be within a given range of levels, as required, to a mixer 40. It is to be noted that there is no preselector which acts upon the signal being measured. A frequency sweep signal is input as a local signal from a sweep oscillator 20 to the mixer 40. The mixer 40 may be a harmonic mixer which frequency mixes the signal being measured, not only with a fundamental wave of the sweep signal, but also with a harmonic wave thereof. In addition, the sweep signal from the sweep oscillator 20 may be frequency multiplied in a frequency multiplier 41 to provide a desired harmonic wave, as desired, before it is fed to the mixer 40. An output from the mixer 40 is passed through a low pass filter 42 to feed an intermediate frequency signal having a desired frequency $F_i$ to an IF assembly 50. An output from the IF assembly 50 or measured data (which is spectrum data in this instance) is fed to an image eliminator 70. The image eliminator 70 suppresses data which result from image signals, which are determined on the basis of the fact that no preselector is provided, from the measured data. The measured data in which the image data is suppressed is fed to a display 90.

According to the first embodiment, in order to suppress image signals, M (where M is an integer equal to or greater than 2) intermediate frequencies $F_i$ are used, and for each intermediate frequency, two frequency sweeps are conducted to determine two sets of measured data (spectrum data), and the image eliminating processing is applied to the 2M sets of measured data. An example of a processing procedure according to the first embodiment will be described with reference to FIG. 8.

Initially, a center frequency $F_c$ and a frequency span $F_s$ are acquired to determine a range of measured frequencies $F1 = f_c-(F_s/2) \sim f_c+(F_s/2)$ and a processing parameter m is initialized to 1 (S1).

For an intermediate frequency $F_{im}$, the frequency of the sweep signal is swept over $F1+F_{im} \sim F2+F_{im}$ (this is referred to as N--mode sweep) to obtain m-th first measured data (S2) where the frequency of the sweep signal has a value which generates the intermediate frequency $F_{im}$ in the mixer 40. Accordingly, where the fundamental wave of an output signal from a sweep oscillator 20 is to act as a sweep signal, the oscillation frequency $f_{osc}$ of the sweep oscillator 20 is varied over $F1+F_{im} \sim F2+F_{im}$ while when the mixer 40 comprises a harmonic wave mixer and an N-th harmonic wave is to act as a sweep signal (local signal), $Nf_{osc}$ is caused to vary over $F1+F_{im} \sim F2+F_{im}$.

In addition, for the intermediate frequency $F_{im}$, the frequency of the sweep signal is swept over $F1-F_{im} \sim F2-F_{im}$ (this is referred to as N+-mode sweep) to determine an m-th second measured data (S3). Either the N--mode processing at step S2 and the N+-mode processing at step S3 may precede each other.

An image eliminating processing is applied to the m-th first measured data and second measured data (S4).

Figure 9:
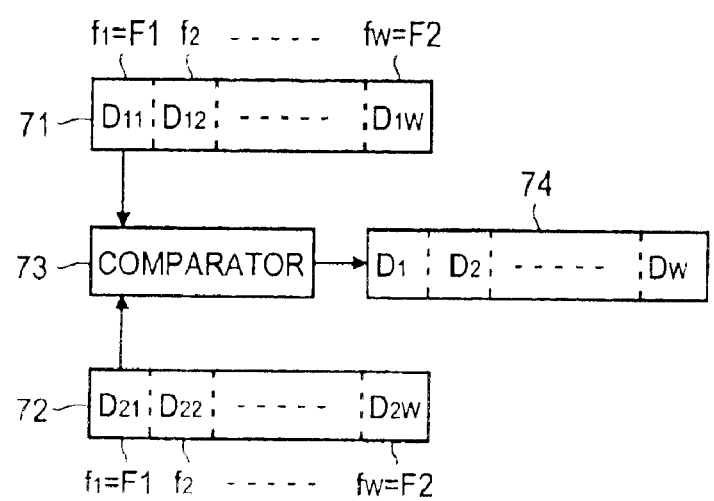
FIG. 9 is a diagram showing a specific example of an image eliminator 70 shown in FIG. 7.

In this manner, for each measured frequency point, first measured data and second measured data are compared against each other to choose a smaller (or smallest) data value. If both data assumes an equal value, that data value is chosen to provide a result of image eliminating processing. By way of example, as shown in FIG. 9, each measured frequency point over F1~F2 may be designated as $f_1, f_2, \ldots, f_W$, and the first measured data which is obtained at each measured measuring point and which is stored in a buffer memory 71 is designated as $D_{11}, D_{12}, \ldots, D_{1W}$ while second measured data stored in a buffer memory 72 are designated as $D_{21}, D_{22}, \ldots, D_{2W}$, and a comparator 73 compares $D_{1j}$ and $D_{2j}$ against each other for each measured frequency point $f_j$ (j=1,2, . . . , W), and delivers $D_{1j}$ if $D_{1j} \leq D_{2j}$, and $D_{2j}$ if $D_{1j \leq D2j}$ as $D_j$, thus providing measured data $D_1, D_2, \ldots, D_W$ which have been subject to an image processing in a buffer memory 74.

While not shown, the buffer memory 74 is capable of storing other data which has been subject to an image elimination processing. The data which has been subject to the image elimination processing may be displayed on the display 90 as required.

An examination is then made to see if m=M (S5) and if m is not equal to M, m is incremented by one before returning to the step S2 (S6).

If m=M at step S5, or when the sweeping measurement in the N--mode and the sweeping measurement in the N+-mode have been conducted for all of predetermined M intermediate frequencies $F_{i1}, F_{i2}, \ldots, F_{iM}$, and the image elimination processing has been completed for them, the image elimination processing takes place upon M measured data which have been subject to the image elimination processing (S7). Thus, for this M data items which have been subject to the image elimination processing, a minimum data value and every same data value are elected for each measured frequency point. The measuring data which have been subject to the image elimination processing at step S7 are fed to the display 90 for displaying the spectrum. It is to be noted that the intermediate frequencies $F_{i1}$, $F_{i2}, \ldots, F_{iM}$ may not be in the descending order, but may be in a predetermined order.

Figure 10:
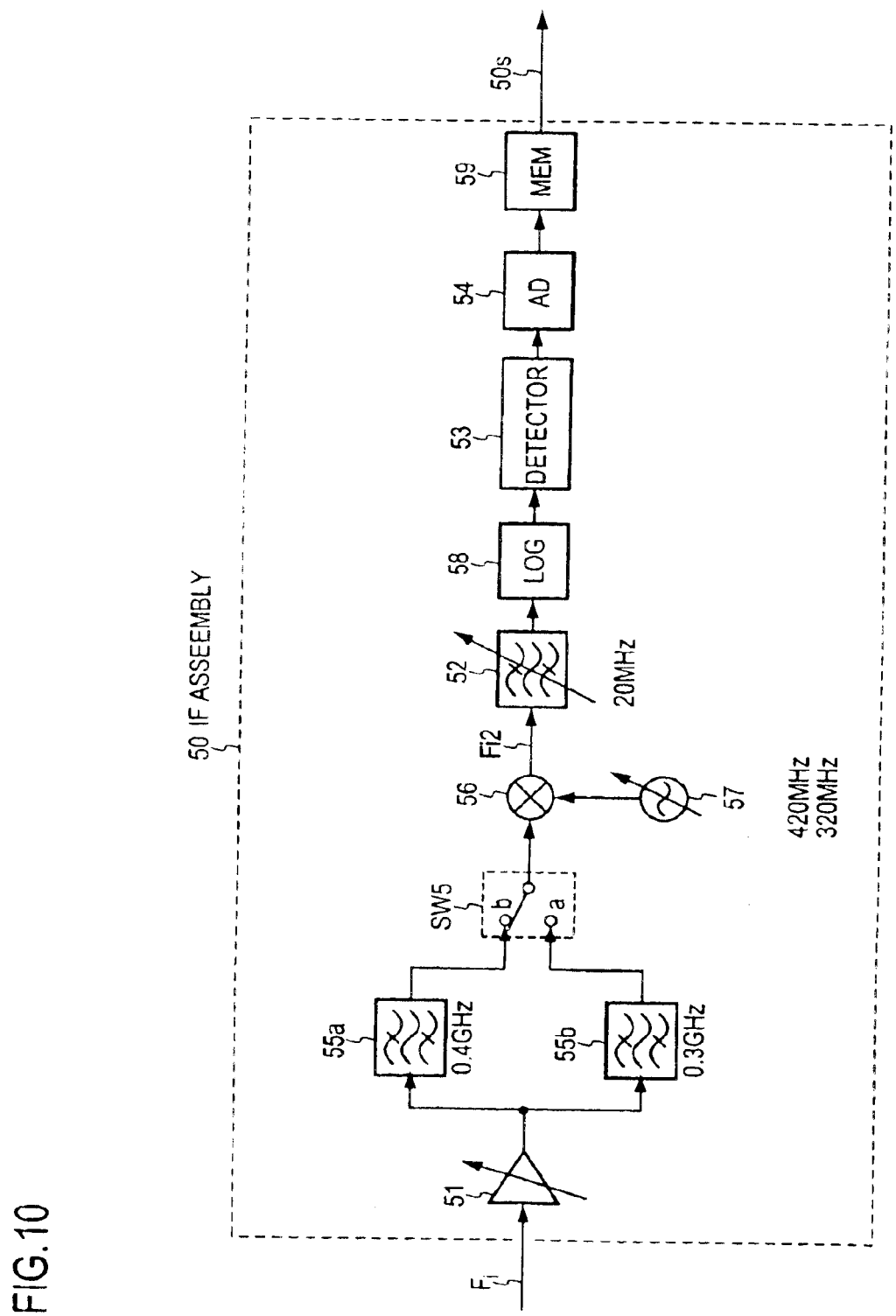
FIG. 10 is a diagram showing a specific example of construction illustrating the principle of the IF assembly 50 shown in FIG. 7 when the first embodiment is applied.

The first embodiment will now be described more specifically for M=2 or when $F_{i1}$ and $F_{i2}$ are used. To give an example, a choice is made that $F_{i1}$=0.4 GHz and $F_{i2}$=0.3 GHz. The IF assembly 50 shown in FIG. 7 may be constructed as shown in FIG. 10, for example. In FIG. 10, as contrasted to FIG. 2, the band-pass filter 55 is replaced by pass bands for the intermediate frequencies $F_{i1}$ and $F_{i2}$. At this end, band-pass filters 55a and 55b are provided.

A change-over switch SW5 is switchably controlled by a sweep controller 100 so that it feeds an output signal from the band-pass filter 55a to a mixer 56 during the sweeping measurement which uses $F_{i1}$=0.4 GHz as an intermediate frequency and to feed an output signal from the band-pass filter 55b to the mixer 56 during the sweeping measurement which uses $F_{i2}$=0.3 GHz as an intermediate frequency. An oscillator 57 which supplies a local signal to the mixer 56 comprises an oscillator capable of generating two oscillation frequencies of 420 MHz and 320 MHz, for example, and is switchably controlled by the sweep controller 100 to provide the oscillation at 420 MHz when the switch SW5 is connected to the filter 55a and to the oscillation at 320 MHz when it is connected to the filter 55b.

A mixer 56 utilizes a signal from the oscillator 57 to convert and delivers a signal from the change-over switch SW5 into a given frequency, which is an intermediate frequency Fi2 of 20 MHz in this example. Subsequent remaining elements operate in the similar manner as in FIG. 2, and therefore will not be described.

With the IF assembly 50 constructed in the manner shown in FIG. 10, if the intermediated frequency component has either a frequency of 0.4 GHz or 0.3 GHz, an IF filter 52 provides a band limitation with a desired resolution bandwidth, allowing a storage in a buffer memory 59 in unit of one sweep.

The sweep controller 100 performs two sweeps, one each in the N--mode and the N+-mode for purpose of measurement for the two intermediate frequencies $F_{i1}$, $F_{i2}$, or for the first intermediate frequency 0.4 GHz and the second intermediate frequency 0.3 GHz, in the similar manner as in the first embodiment. As a consequence, spectrum data (measured data) under a total of four conditions are each acquired.

Figure 11:
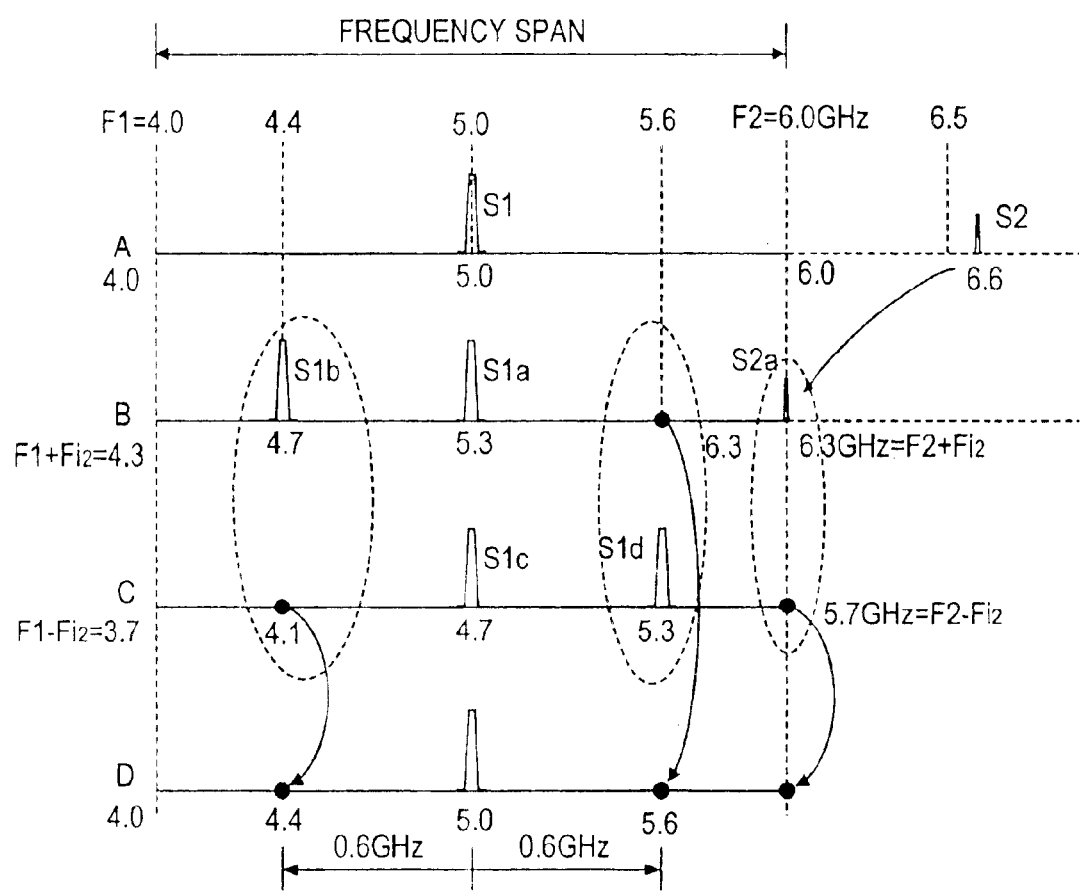
FIG. 11 is a diagram illustrating the image elimination in the first embodiment.

The image eliminator 70 receives the measured data under four conditions, and eliminates unnecessary image data. This image elimination processing will now be described with reference to FIGS. 6 and 11. The various conditions are same as in the previous instance which has been described in connection with FIG. 6.

Figure 6:
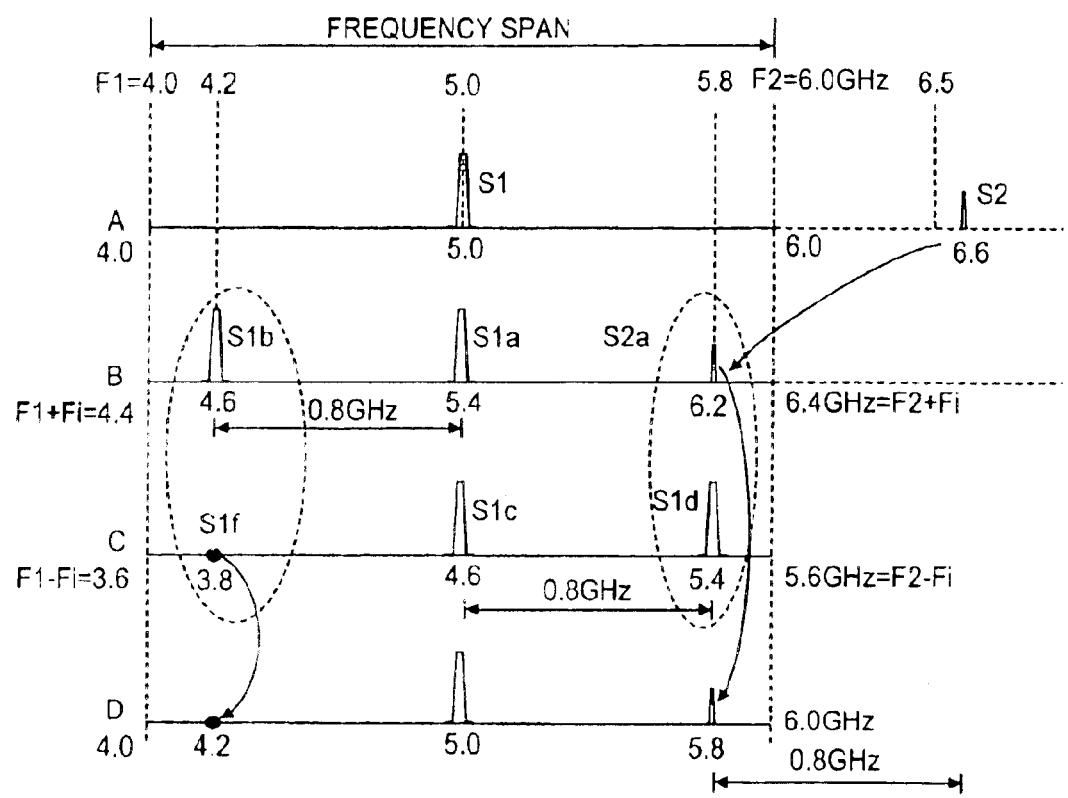
FIG. 6 is a diagram illustrating problems occurring with the spectrum analyzer shown in FIG. 4.

When the first intermediate frequency $F_{i1}$ is equal to 0.4 GHz, the first measured data shown in FIG. 6B and the second measured data shown in FIG. 6C are acquired in entirely the same manner as described above in connection with FIG. 6, and a result of the image elimination processing upon these measured data is shown by the data illustrated in FIG. 6D.

When the second intermediate frequency $F_{i2}$ is equal to 0.3 GHz, the N--mode sweep takes place over 4.3 GHz(= F1+$F_{i2}$)~6.3 GHz(=F2+$F_{i2}$) as shown in FIG. 11B while the N+-mode sweep takes place over 3.7 GHz(=F1-$F_{i2}$)~5.7 GHz(=F2-$F_{i2}$) as shown in FIG. 11C. Accordingly, during the N--mode, the image data S1b responsive to the input signal S1 at 5 GHz appears at a measured frequency point 4.4 GHz, as shown in FIG. 11B. Image data S2a responsive to the input signal S2 at 6.6 GHz appears at a measured frequency point 6.0 GHz. In other words, image data S1a and S2a have been moved by 0.2 GHz to the right, as compared against FIG. 6B. In the N+-mode, image data S1d responsive to the input signal S1 at 5 GHz appears at a measured frequency point 5.6 GHz, as shown in FIG. 11C. When the both measured data obtained during the N--mode and the N+-mode are subject to the image elimination processing, unnecessary image data S1b, S1d and S2a are eliminated, resulting in an outcome shown in FIG. 11D. However, it should be noted that although the elimination has been attained as a result of assuming the presence of only the input signal S2 as a signal located outside the range of set-up measured frequencies F1~F2, if other frequency signals (5.6 GHz±0.3 GHz) are present as unnecessary image signals, it is possible that unnecessary spectrum data may exist in FIG. 11D, in the similar manner as in FIG. 6D.

What is to be noted here is the fact that because the intermediate frequency has been changed to 0.3 GHz for purpose of the sweeping measurement, a measured frequency point for image data S1b of the input signal S1 (FIG. 11C) or the position in the buffer memory 59 where it is stored (measured frequency point) has moved from 5.8 GHz which prevailed fro the intermediate frequency of 0.4 GHz to 5.6 GHz.

The both spectrum data (measured data) which are obtained as a result of the image elimination for the first intermediate frequency $F_{i1}$ and the second intermediate frequency $F_{i2}$, or the data shown in FIGS. 6D and 11D, respectively, are additionally subject to the image elimination processing. Specifically, for each measured frequency point, a smaller data value and a same data value are elected from the both data. As a result, non-image data at a measured frequency point 5.0 GHz or data responsive to the input signal S1 remains unchanged if it is subjected to the additional image elimination processing because the data shown in FIGS. 6D and 11D exist at the same measured frequency point. Conversely, image data S1$d$ from the input signal S1 exists at a measured frequency point 5.8 GHz in FIG. 6C, and exists at a measured frequency point 5.6 GHz in FIG. 11C, and accordingly, if the spectrum data for the both exist at 5.8 GHz in FIG. 6D, for example, the measured frequency point of the image data S1$d$ is positively eliminated by the additional image elimination processing because of a difference between 5.8 GHz and 5.6 GHz. In other words, according to the image elimination processing between the both data shown in FIGS. 6D and 11D, the data shown in FIG. 11D is elected at the measured frequency point 5.8 GHz, and a resulting display of the spectrum will be as shown in FIG. 11D, providing a normal display of the spectrum.

In this manner, when two different intermediate frequencies are employed and the sweep measurement is made each in the N--mode and the N+-mode, the resulting image elimination processing allows a display of a spectrum (measured data) in which unnecessary image signals which may be caused by a signal having a frequency outside the target of measurement is positively eliminated to be obtained.

When M intermediate frequencies are used, the choice of such intermediate frequencies and the sequence in which the N--mode and the N+-mode are executed may be arbitrary. In addition, the image elimination processing may be collectively applied after obtaining all of measured data.

Figure 12:
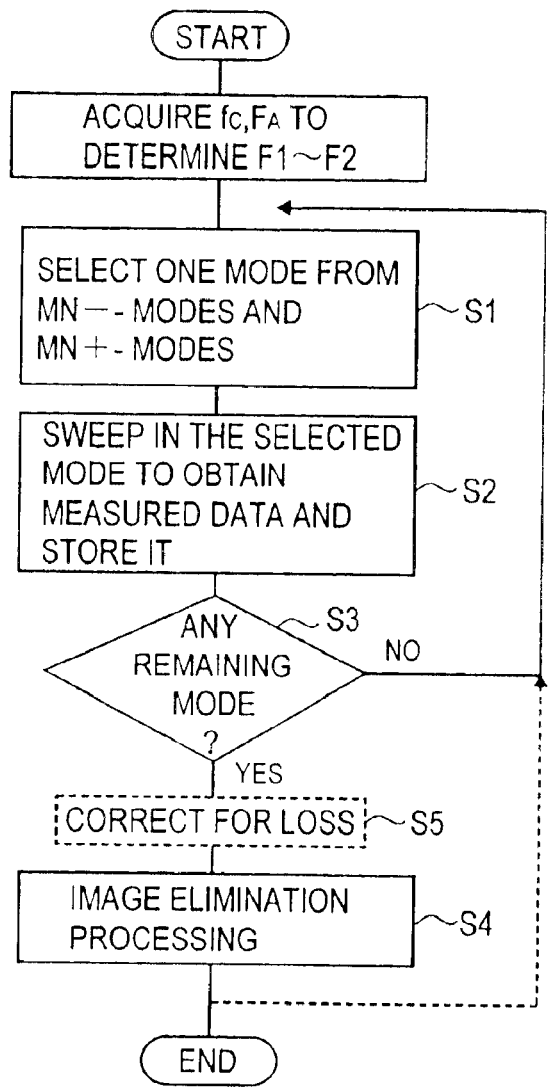
FIG. 12 is a flow chart showing another example of the processing according to the first embodiment.

By way of example, as shown in FIG. 12, a center frequency $f_c$ and a frequency span $F_s$ are acquired to determine a range of set-up measurement, and then one mode is selected (S1) from 2M modes including M N+-modes and M N--modes for M intermediate frequencies $F_{im}$ (i=2, ... M). The sweep takes place in the selected mode to acquire measured data, which is then stored in a buffer memory (S2). An examination is made to see if there is any mode which has not been selected (S3), and if there remains any mode, the operation returns to step S1, and one from the remaining modes is selected. If there is no remaining mode at step S3, the image elimination processing is collectively applied to 2M measured data which are stored in the buffer memory (S4).

Figure 13:
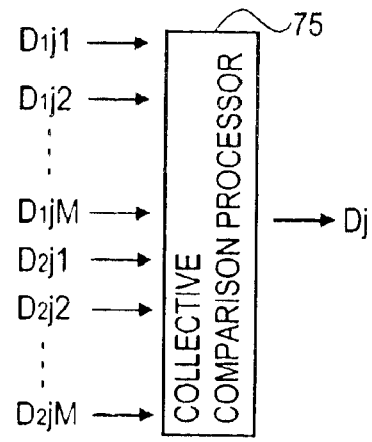
FIG. 13 is a diagram illustrating an image erasure processing which takes place at step S4 shown in FIG. 12.

The collective processing takes place by taking data $D_{1j}1$, $D_{1j}2$, ..., $D_{1j}M$, $D_{2j}1$, $D_{2j}2$, ..., $D_{2j}M$ for each measured frequency point $f_j$ from the buffer memory (not shown, equivalent to the buffer memory 59 shown in FIG. 10) in which 2M measured data are stored, as shown in FIG. 13, for example, inputting them to a collective comparation processor 75, and delivering a data value thereof if all of 2M data are all equal to each other, or a minimum data value among 2M data as $D_j$. This process is repeated for the measured frequency points $f_1$~$f_W$, thus obtaining data $D_1$, $D_2$, ..., $D_W$ which have been subjected to the image elimination processing.

When the processing shown in FIG. 12 is repeated, the measured data which have been subjected to the image elimination processing at step S4 may be fed to the display 90 before returning to the step S1.

Figure 14:
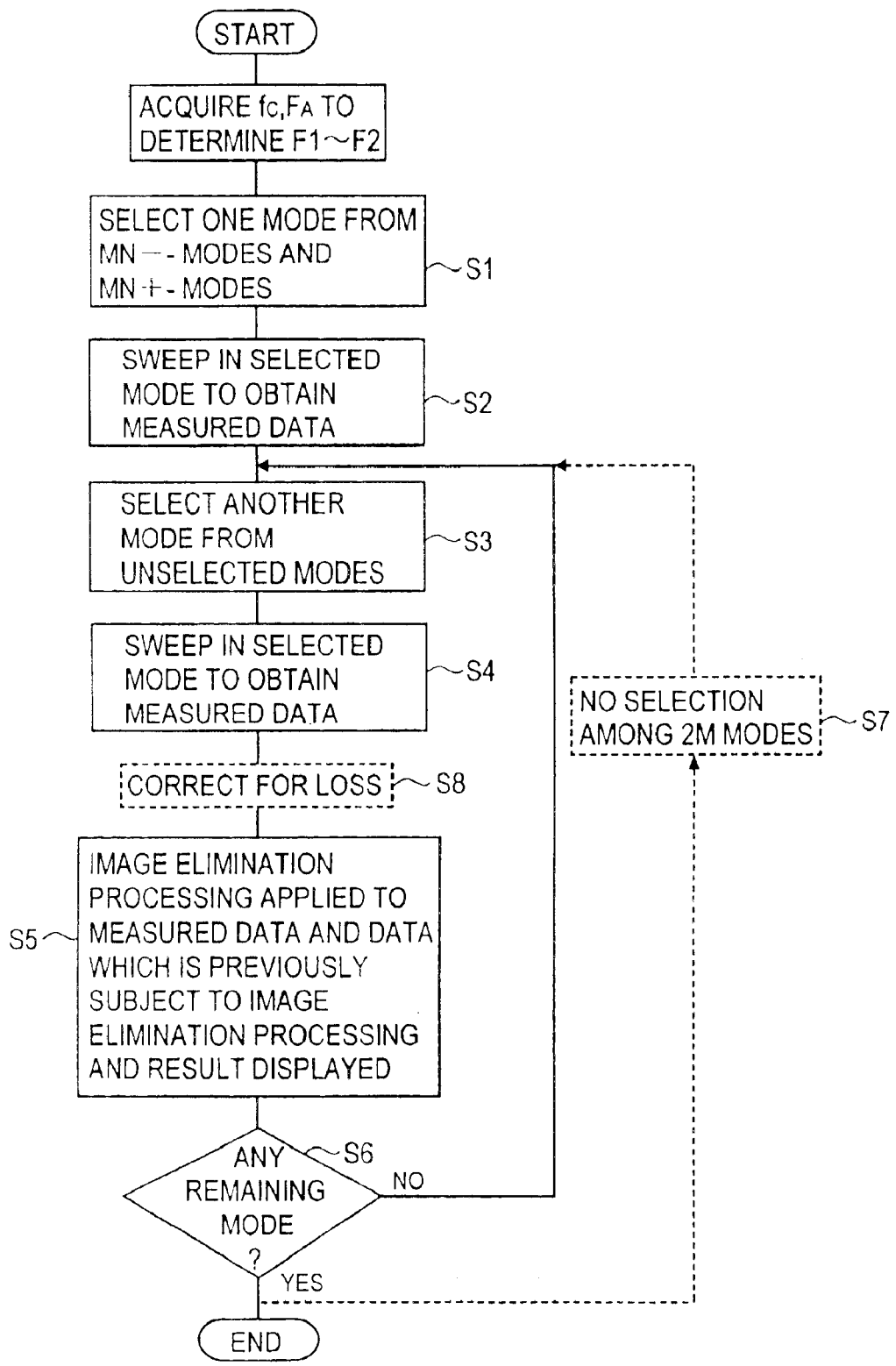
FIG. 14 is a flow chart showing a further example of the processing according to the first embodiment.

The image processing may take place each time upon completion of one of the modes. For example, as shown in FIG. 14, a center frequency $f_c$ and a frequency span $F_s$ are acquired to determine a range of set-up measurements F1~F2, and then one from 2M modes including M N--modes and M N+-modes is selected (S1), and a sweep takes place in the selected mode to acquire measured data (S2). Another mode which has not yet been selected is selected from 2M modes (S3) and the sweep takes place in the selected mode to acquire measured data (S4). Image elimination processing is applied to this measured data and to the previous data which has been subjected to the image elimination processing (S5). However, during the initial image elimination processing, measured data obtained at step S2 is used as data which is subjected to the image elimination processing. The data which has been subjected to the image elimination processing at step S5 or successive results of the image elimination processing may be fed to the display 90 as required, thus allowing the behavior of measured data to be displayed as early as possible.

At step S6, an examination is made to see if there remains any mode which has not yet been selected. If there remains any unselected mode, the operation returns to step S3, and if there remains no mode which has not been selected, the operation is completed. However, when the measurement is to be continued, a control over any mode which remains at step S7 may be initialized to the initial condition where none of 2M modes has been selected before transferring to step S3.

Figure 8:
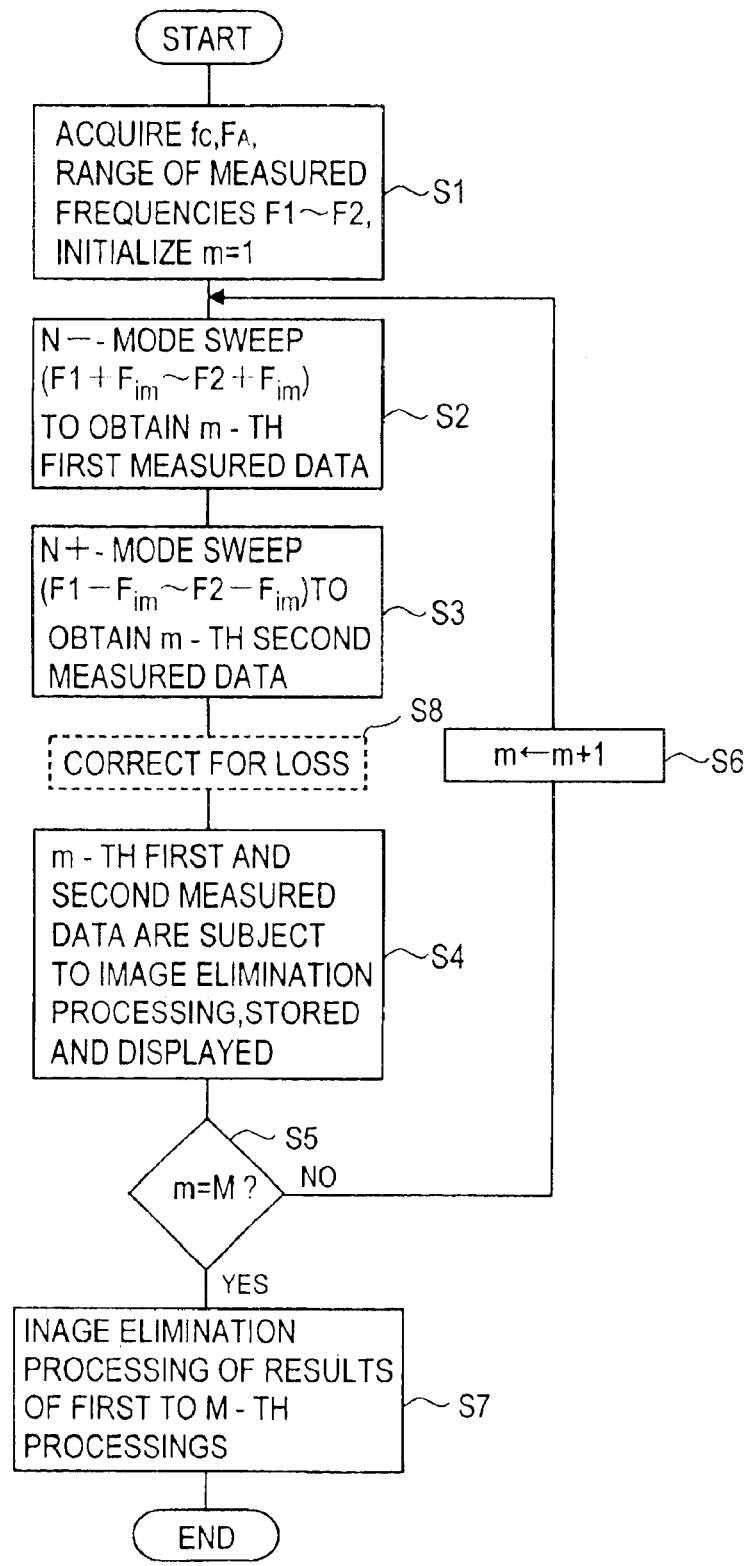
FIG. 8 is a flow chart of an example of a processing according to the first embodiment of the present invention.

As will be understood from the embodiments shown in FIGS. 8 and 14, the selection of the mode, the sweep, the acquisition of measured data may be performed a plurality of times, and the image elimination processing may be repeatedly applied to the plurality of measured data or the previous data which has been subjected to the image elimination processing. In the embodiment shown in FIG. 8, the image elimination processing upon measured data which is obtained at m=M-1 at step S4 may be modified so as to perform the image elimination processing upon a result of the image elimination processing which has been performed upon measured data obtained during the first to the (M-2)-th run, thus omitting step S7.

In the embodiments shown in FIGS. 12 and 14, a sequence in which the intermediate frequencies are selected may be arbitrary, but it is preferred that whenever one of the N--mode and the N+-mode is selected for one intermediate frequency $F_{im}$, the other mode for the same $F_{15}$ be selected for the next. This reduces a number of times that the switch SW5 and the oscillator 57$b$ within the IF assembly 50 shown in FIG. 10 are controlled.

Second Embodiment

Figure 15:
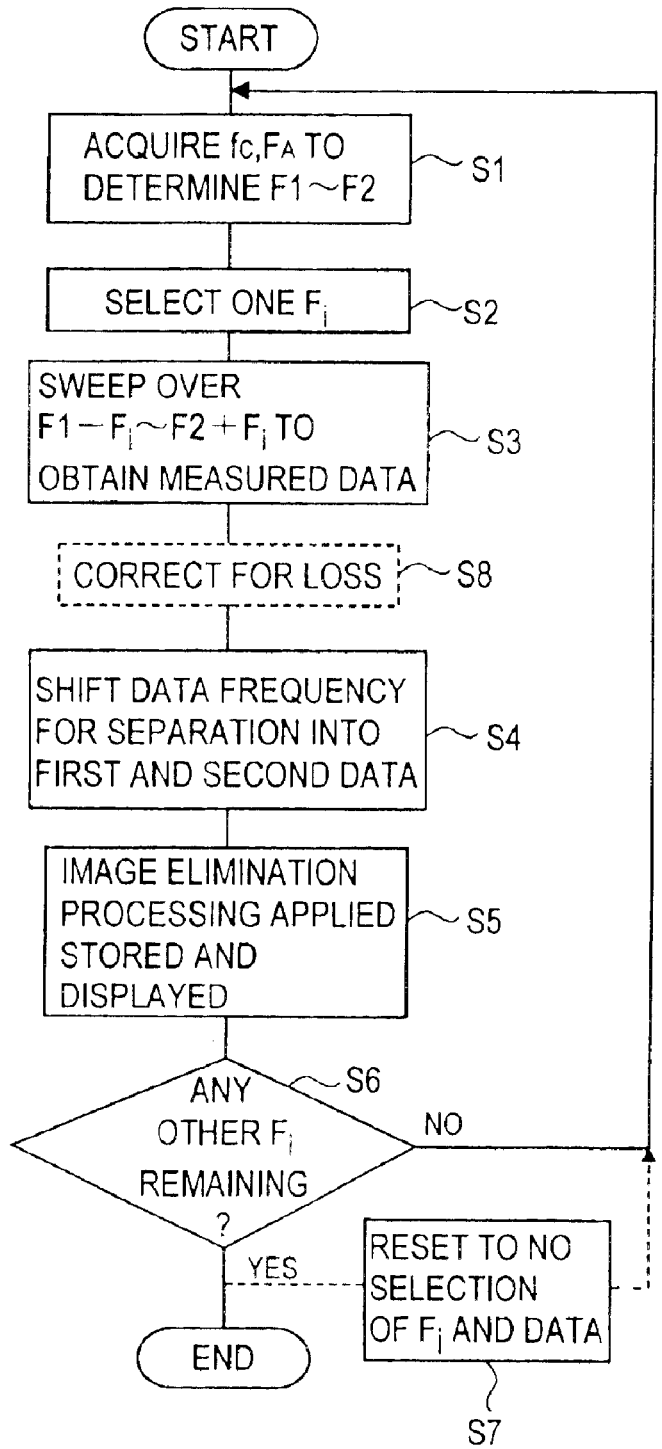
FIG. 15 is a flow chart showing an example of the processing procedure according to a second embodiment of the present invention.

An embodiment of another aspect of the present invention (second embodiment) as applied to a spectrum analyzer will now be described. The functional arrangement of the spectrum analyzer is substantially similar to that shown in FIG. 7 except that a data separator 80 is inserted on the input side of the image eliminator 70, as shown in broken lines. An example of the processing procedure of the second embodiment is shown in FIG. 15.

Initially, a center frequency $f_c$ and a frequency span $F_s$ are acquired to determine a range of measured frequencies F1~F2 (S1), one, $F_i$, of determined M intermediate frequencies is selected (S2), and a sweep signal sweeps a range between a frequency F1−$F_i$ or the lower limit value F1 of the range of set-up measured frequencies from which $F_i$ is subtracted and a frequency F2+$F_i$ or the upper limit value F2 added with $F_i$ to acquire measured data (S3).

The sweep over F1−$F_i$~F2+$F_i$ is referred to as a collective mode sweep.

The resulting measured data is separated in the data separator 80 shown in FIG. 7 into first measured data which is obtained by shifting the frequency in the lower direction by $F_i$, and second measured data which is obtained by shifting the frequency in the higher direction by $F_i$, thus obtaining data which correspond to the first measured data resulting from the N--mode and the second measured data resulting from the N+-mode in the first embodiment (S4).

The image elimination processing is applied to the first measured data, the second measured data and previous data which has been subjected to the image elimination (S5). Specifically, for each measured frequency point of these three data items, a minimum data value and a same data value are elected to obtain data which has been subjected to the image elimination. It should be noted that during the first processing or when the intermediate frequency is selected for the first time, there exists no data which has been subjected to the image elimination processing, and accordingly the image elimination processing is applied to the first measured data and the second measured data. The data which has been subjected to the image elimination processing is temporarily stored in a buffer memory for use in the next image elimination processing and is also fed to the display 90.

What is fed to the display 90 may be each measured frequency point data which is successively processed during the image elimination processing.

An examination is then made to see if there remains any intermediate frequency $F_i$ which has not yet been selected (S6), and if there is one, the operation returns to step 2 and an unselected one is selected. When there remains no intermediate frequency which has not been selected at step S6, the operation may be completed or if the measurement is to be continued, the operation is reset to a condition where none of the intermediate frequencies has yet been selected, thus returning to step S2 (S7).

Figure 16:
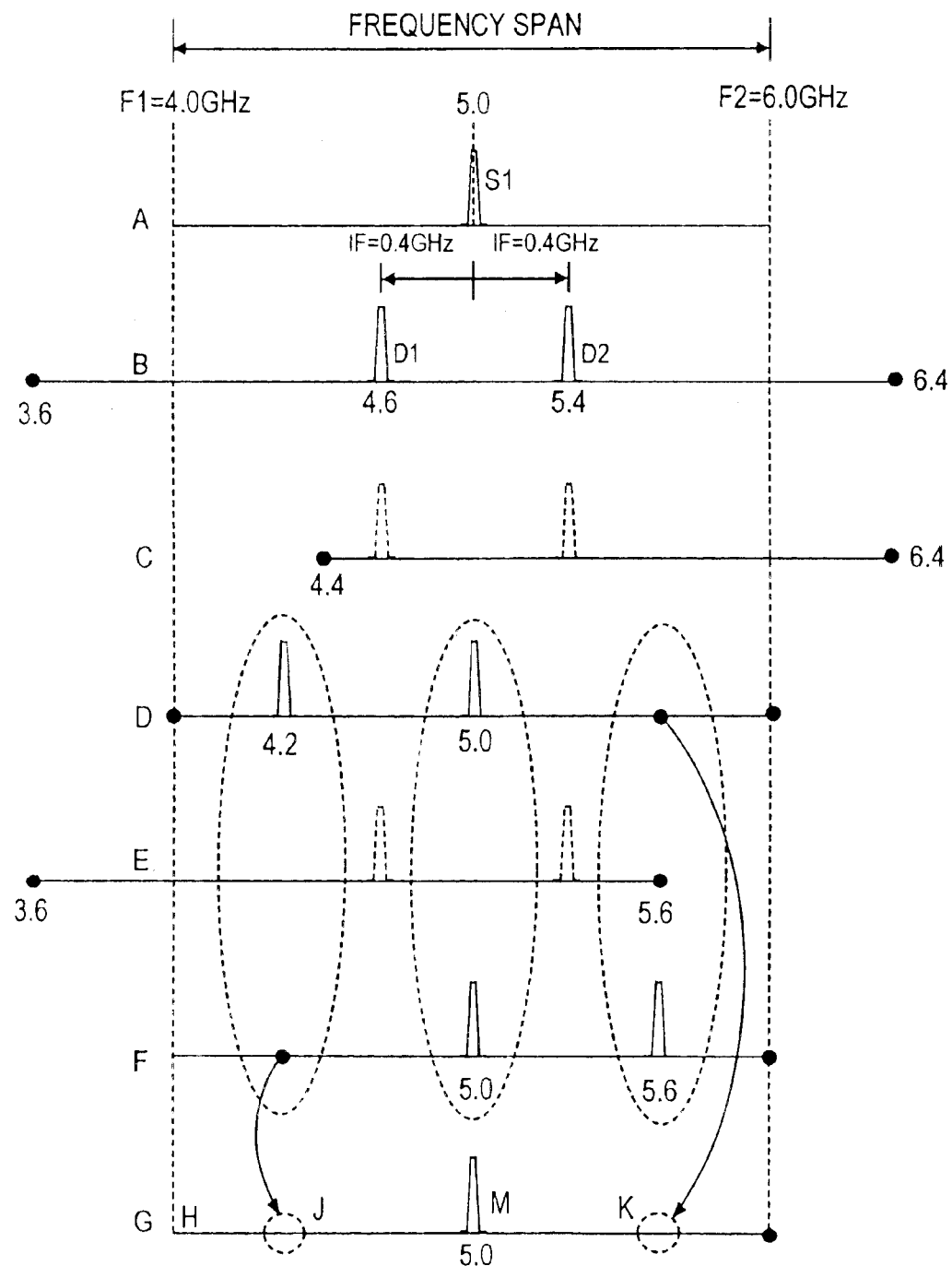
FIG. 16 is a diagram showing the image elimination according to the processing shown in FIG. 15.

Part of the data separation processing which takes place at step S4 will be described below in terms of a specific example with reference to FIG. 16. In the similar manner as in the example shown in FIG. 11, the center frequency $f_c$=5 GHz, the frequency span $F_S$=2 GHz, a range of set-up measurement F1=4.0 GHz~F2=6 GHz, the selected intermediate frequency $F_i$=0.4 GHz are assumed and it is also assumed that a signal being measured only comprises 5 GHz as shown in FIG. 16A. The range of swept frequencies will be F1-$F_i$=3.6 GHz~F2+$F_i$=6.4 GHz, as shown in FIG. 16B, and measured data D1 and D2 are obtained at the sweep frequencies of 4.6 GHz and 5.4 GHz, respectively, as a result of the sweep. Since the range of frequencies during the N--mode sweep in the first embodiment is over 4.4 GHz~6.4 GHz, as shown in FIG. 16C, a movement along the frequency axis in the lower direction by the intermediate frequency $F_i$=0.4 GHz so as to correspond to the sweep over the range of set-up measured frequencies 4 GHz~6 GHz results in a coincidence with the N--mode sweep. Accordingly, the measured data which is obtained by the sweep over F1-$F_i$~F2+$F_i$ may be shifted so as to lower the frequency by the intermediate frequency $F_i$=0.4 GHz, as shown in FIG. 16D, to provide first measured data, thereby obtaining one which coincides with the first measured data obtained during the N--mode. Similarly, since the frequency range of the N+-mode sweep is over 3.6 GHz~5.6 GHz, as shown in FIG. 16E, this may be moved along the frequency axis by the intermediate frequency $F_i$0.4 GHz in the higher direction so as to correspond to the range of set-up measured frequencies 4 GHz~6 GHz, thus achieving a coincidence with the N+-mode sweep. Accordingly, the measured data which is obtained by the sweep over F1-$F_i$~F2+$F_i$ may be moved to increase the frequency by the intermediate frequency $F_i$=0.4 GHz, as shown in FIG. 16F, to provide the second measured data, which coincides with second measured data which is obtained during the N+-mode.

This separation processing may comprise deriving, from the measured data which is obtained by the sweep over F1-$F_i$~F2+$F_i$ and which is stored in a buffer memory in the sequence of the measured frequency points, data for every measured frequency point which is located higher than the measured frequency point which is by twice the intermediate frequency 2$F_i$ higher than the lowest measured frequency point as the first measured data over the range of set-up measured frequencies, and successively electing data which are located from the lowest measured frequency point in a range corresponding to the range of set-up measured frequencies to provide the second measured data over the range of set-up measured frequencies.

As a consequence, the image elimination processing may be applied to the first measured data shown in FIG. 16D and the second measured data shown in FIG. 16F which are separated in this manner, thus obtaining data shown in FIG. 16G in which the image data is suppressed. The separation processing at step S4 may be similarly applied to other intermediate frequencies. According to the second embodiment, the number of sweeps will be reduced to ½ as compared with the first embodiment, thus reducing the measurement time interval.

Figure 17:
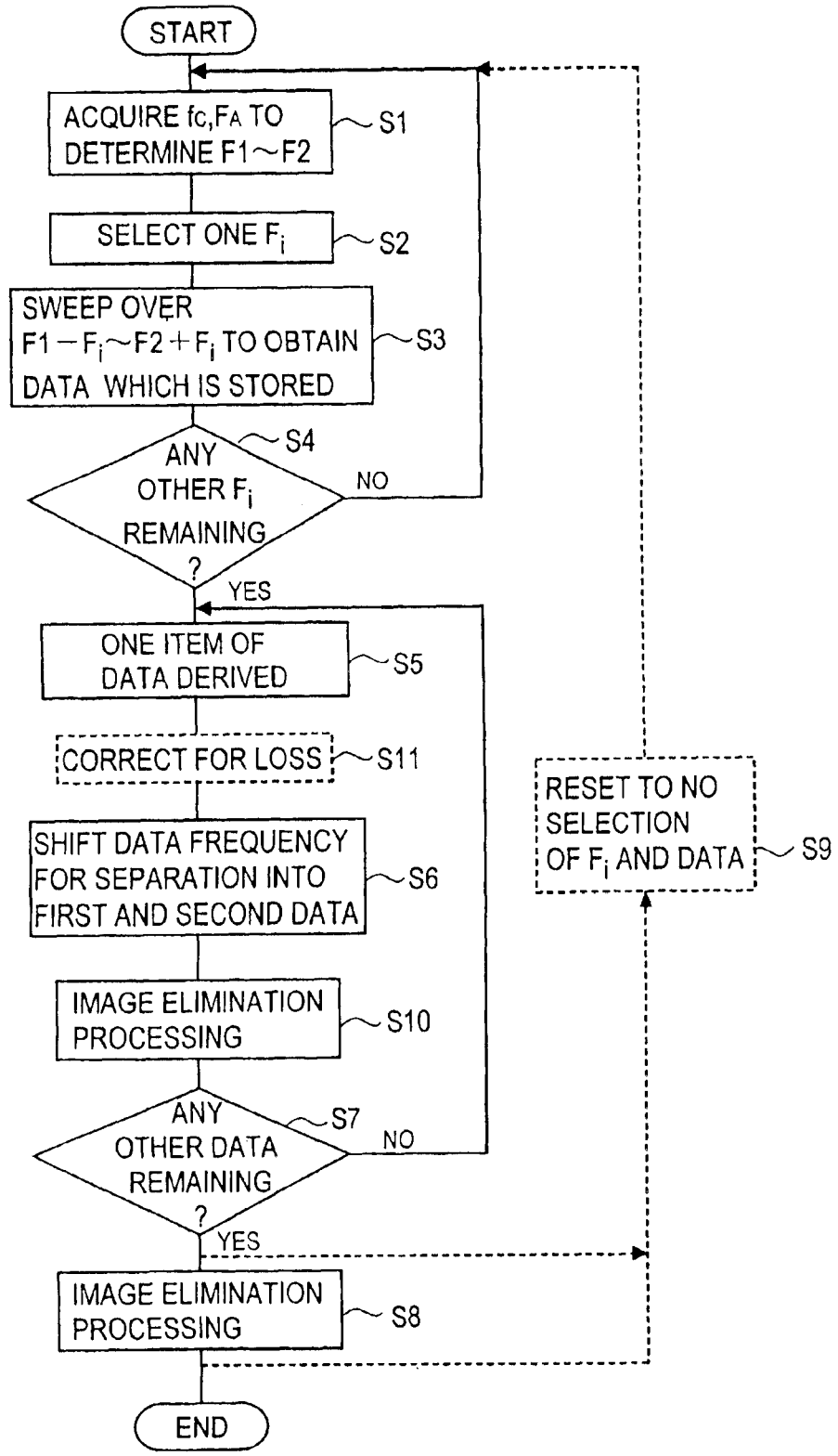
FIG. 17 is a flow chart showing another example of processing procedure according to the second embodiment of the present invention.

FIG. 17 shows another example of the processing procedure according to the second embodiment. Initially, a center frequency $f_c$ and a frequency span $F_s$ are acquired to determine a range of set-up measured frequencies F1~F2 (S1). One of the intermediate frequencies $F_i$ is then selected (S2), and F1-$F_i$~F2+$F_i$ is swept by the sweep signal to acquire measured data, which is stored in the buffer memory (S3). An examination is then made to see if there remains any intermediate frequency $F_i$ which has not yet been selected (S4), and if there is one, the operation returns to step S2 while if there remains none, one of measured data which is stored in the buffer memory is taken out (S5), and the frequency shift mentioned above is applied to the measured data which is taken out to separate it into the first measured data and the second measured data (S6).

An examination is then made to see if there remains any measured data in the buffer memory (S7), and if there remains one, the operation returns to step S5 while if there is none, the image elimination processing is applied to all of the first measured data and the second measured data which have been separated for each intermediate frequency, or for 2M items(where M represents the number of intermediate frequencies) of measured data (S8). This image elimination processing is similar to the processing which takes place at step S4 in FIG. 12. If the measurement is to be continued, the operation is reset to a condition to select an intermediate frequency and measured data, thus returning to step S2 (S9). As indicated in FIG. 17, subsequent to the step S6, the image elimination processing may be applied to the first measured data and the second measured data which have been separated and the previous data which has been subjected to the image elimination processing, and a result of such processing or results of intermediate processings which are successively obtained may be fed to and displayed by the display 90 (S10).

In this instance, when the measured data is derived to be subject to the separation processing for the first time, the image elimination processing is applied to only the first and the second measured data (since there exists no previous data which has been subjected to the image elimination processing).

A signal being measured undergoes a conversion loss in the mixer 40. It is found that the conversion loss is different between the N--mode sweep and the N+-mode sweep and that it changes with the frequency. In order to provide a correct measurement in consideration of this, it is preferable that the measured data from the IF assembly 50 be subject to a level correction in a level corrector 60 before it is fed to the image eliminator 70, as shown in broken lines in FIG. 7.

Figure 18:
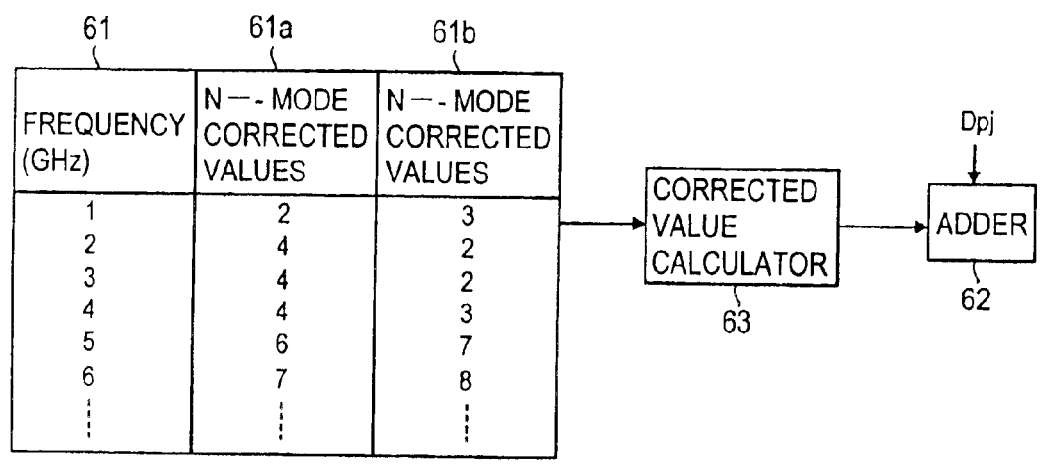
FIG. 18 is a diagram showing a specific example of a corrector unit 60 shown in FIG. 7.

As illustrated in FIG. 18 by way of example, the corrector 60 may comprise a corrected value storage 61 which stores corrected values at an interval of the frequency of the signal being measured, which is at the interval of 1 GHz in FIG. 18. The losses occurring in the mixer 40 during the N--mode sweep and the N+-mode sweep are previously determined to provide the corrected values which are stored.

For measured data $D_{pj}$ (p=1,2; j=1,2, . . . , W) from the IF assembly 50, a corrected value for a measured frequency point $f_j$ is derived from an N--mode corrected value storage 61*a* for p=1 and derived from an N+-mode corrected value storage 61*b* for p=2, and the corrected value is added to the measured data $D_{pj}$ in an adder 62. If the corrected value for a frequency which coincides with the measured frequency point $f_j$ is not stored in the corrected value storage 61, corrected values for frequencies across the frequency $f_j$ are derived from the corrected value storage 61, and the corrected value for $f_j$ is calculated in a corrected value calculator 63 as by linear interpolation to feed it to the adder 62.

By correcting the measured data for the conversion loss depending on the N--mode and the N+-mode in this manner, the image elimination processing can be performed correctly, allowing a more accurate indication of the measured data.

The correction for the conversion loss may take place at step 8 which follows step S3 to apply the correction for the conversion loss to the measured data before transferring to step S4, as shown in broken lines, in the example of FIG. 8, or may take place at step S5 when transferring from step S3 to step S4 in the example of FIG. 12, or may take place at step 8 which follows step S4 before transferring to step S5 in the example of FIG. 14. In the example shown in FIG. 15, the correction of the measured data for the conversion loss may take place at step 8 which follows step S3 before transferring to step S4. In this instance, there is only one set of corrected values. Similarly, in the example shown in FIG. 17, the correction of measured data for the conversion loss may take place at step S11 which follows step S5. It is desirable that the N--mode conversion loss correction data and the N+-mode conversion loss correction data be previously determined for each intermediate frequency and stored in the corrected value storage 61 so that an appropriate correction be applied to each intermediate frequency used.

Figure 4:
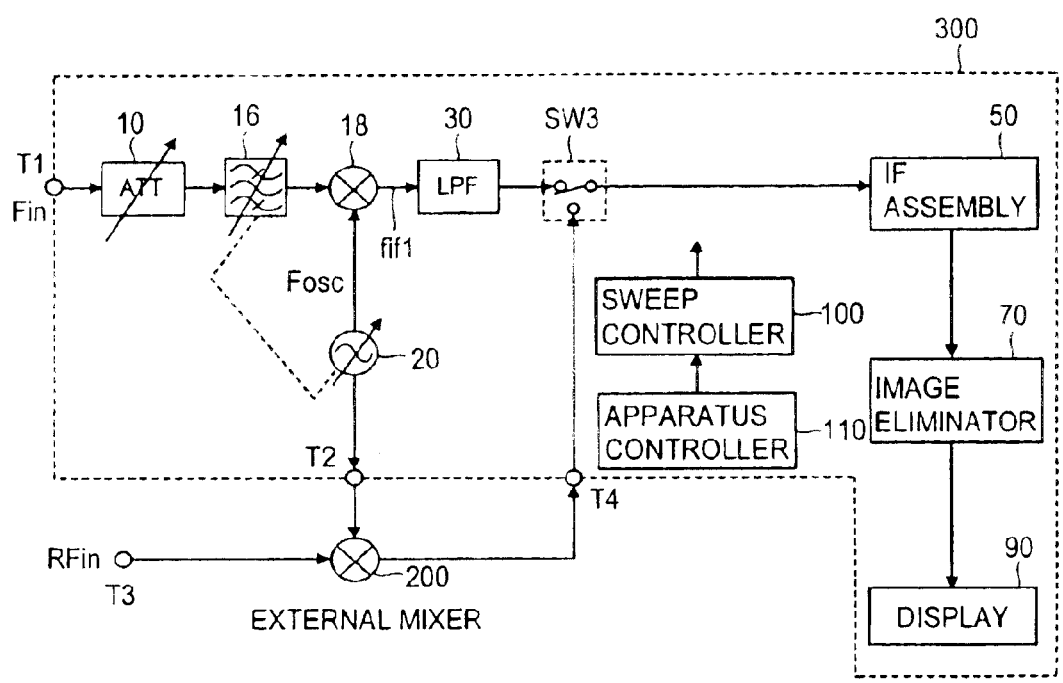
FIG. 4 is a diagram of an arrangement, illustrating the principle of another example of a conventional spectrum analyzer.
Figure 5:
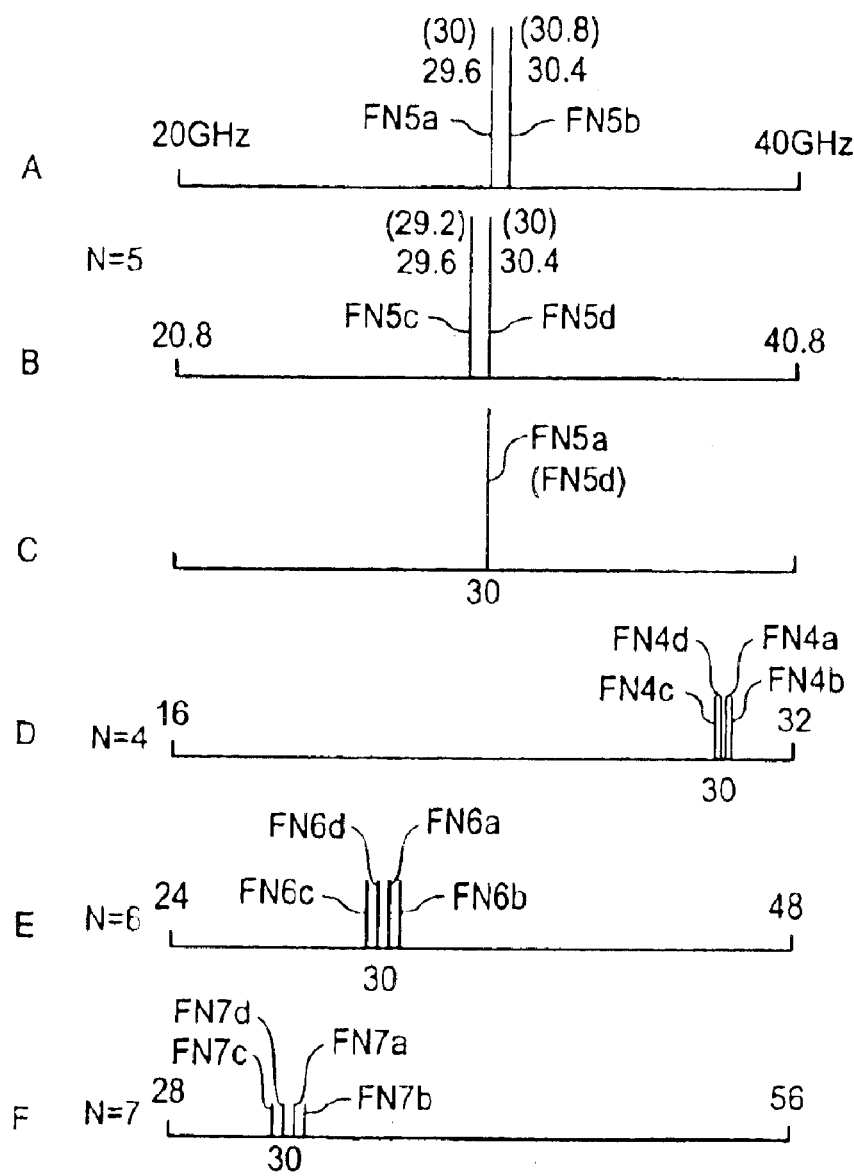
FIG. 5 is a diagram illustrating an image suppression in the spectrum analyzer shown in FIG. 4.

When a plurality of intermediate frequencies are used as mentioned above, it is preferred that the image elimination processing be applied after the correction for the mixer loss be applied to each measured data in the corrector 60 shown in FIG. 4.

Figure 19:
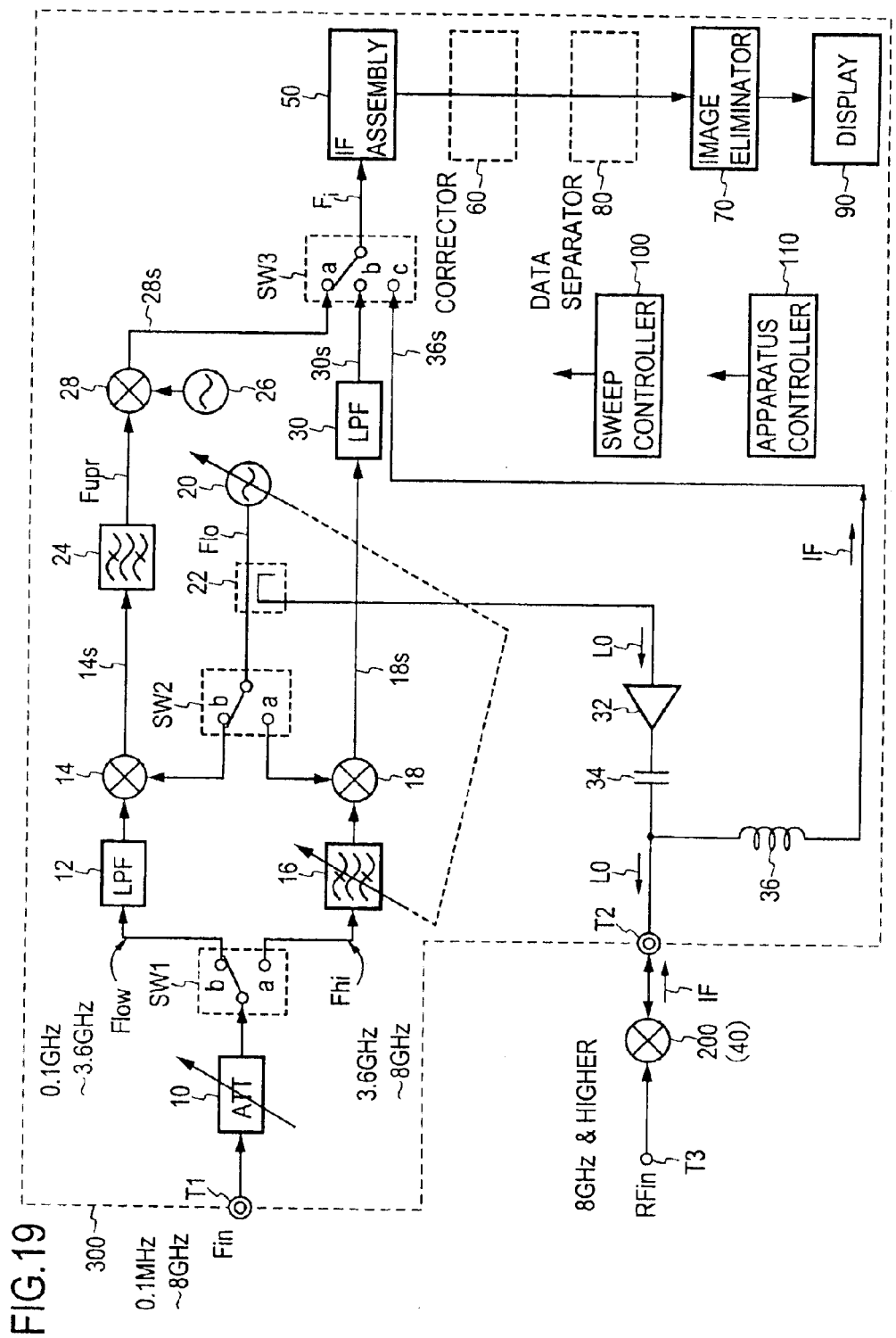
FIG. 19 is a diagram showing an exemplary arrangement when the present invention is applied to part of a conventional spectrum analyzer.

As shown in FIG. 19, the method according to the present invention may be applied to only the measurement of the super-high band RFin shown in FIG. 1 which is equal to or higher than 8 GHz. Specifically, the plurality of external band-pass filters 202 or the variable tuning filter 204 are omitted from the arrangement shown in FIG. 1, while the image eliminator 70 is provided to apply the image elimination processing to the measurement in excess of 8 GHz. Accordingly, a mixer 40 may be provided externally of an existing spectrum analyzer which is constructed within the casing 300, for example, and a software (program) which performs the control of the N+-mode and the N--mode sweep or the collective mode sweep and the image elimi- nation processing may be internally housed within the spectrum analyzer, thereby enabling a measurement of the signal being measured which is in excess of 8 GHz to be performed in a simple and inexpensive manner.

While not shown, an arrangement which applies the N--mode and the N+-mode and the image elimination processing may be used in a measurement of the high band Fhi of 4~8 GH in the arrangement of FIG. 1, for example. In this instance, the expensive YIG tuning filter 16 shown in FIG. 1 can be dispensed with advantageously.

Alternatively, an arrangement which applies the N--mode, the N+ mode and the image elimination processing may be used in the measurement of the high band Fhi of 4~8 GH and the super-high band RFin of 8 GHz or higher in the arrangement shown in FIG. 1.

Figure 2:
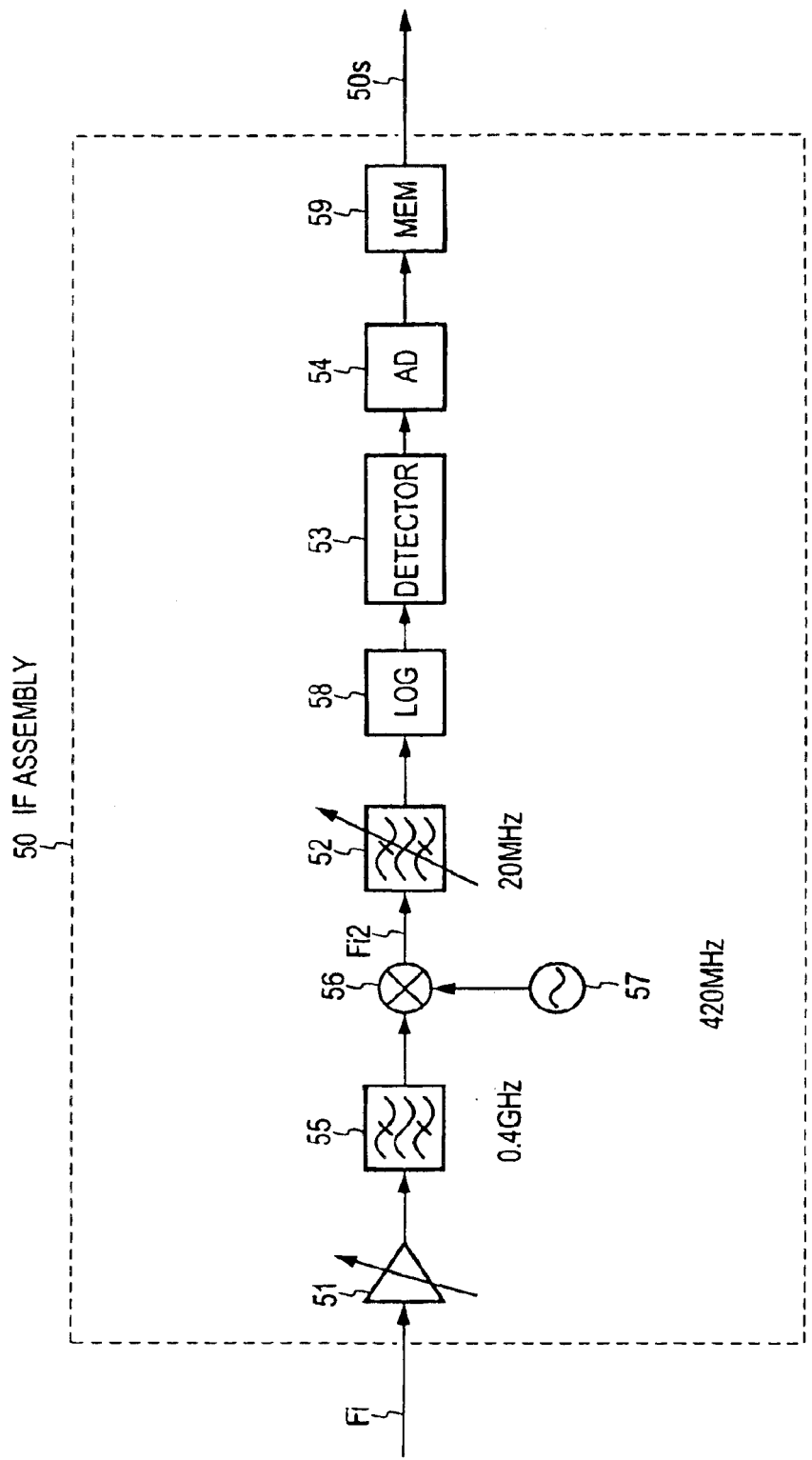
FIG. 2 is a diagram showing the internal construction of an IF assembly 50 shown in FIG. 1.
Figure 3:
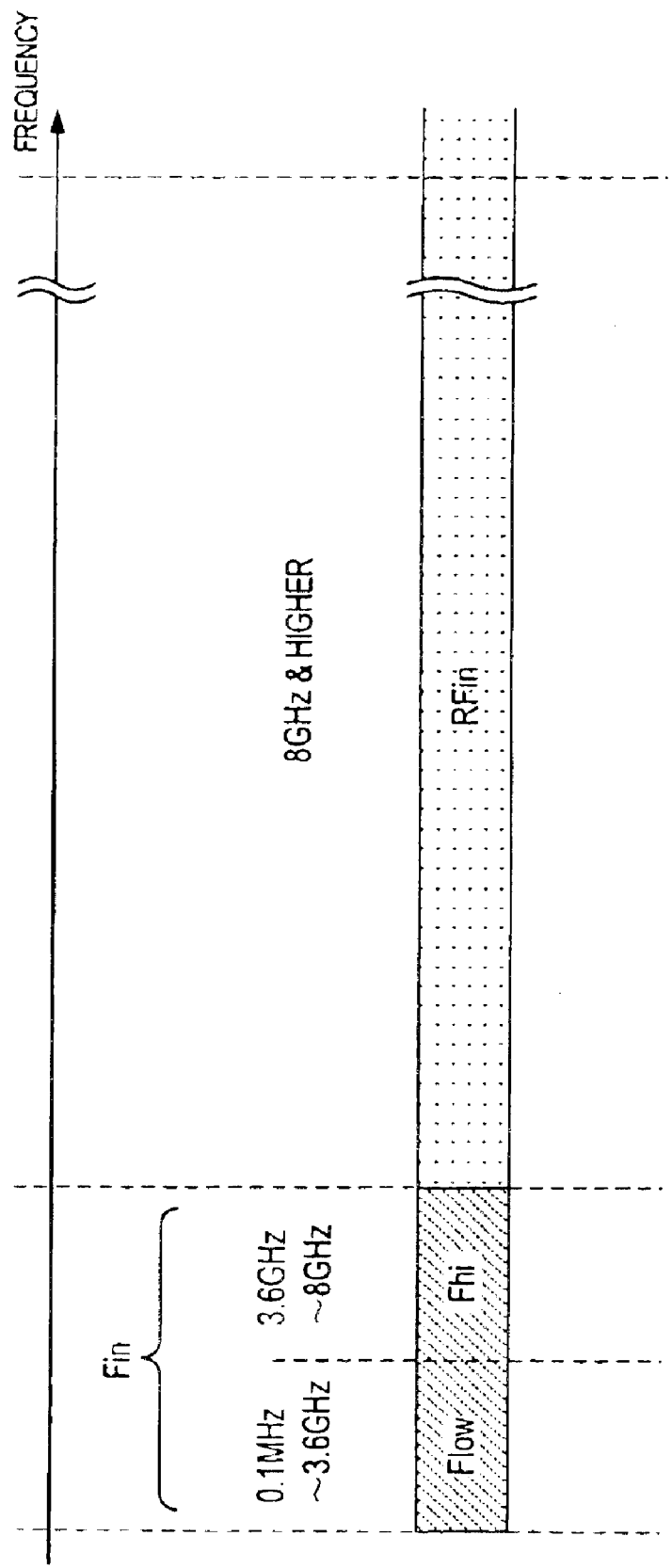
FIG. 3 is a diagram showing the division of frequencies in which the entire range of measured frequencies is divided into three frequency bands for purpose of measurement.

It is to be noted that in the arrangement of the IF assembly 50 shown in FIG. 10, because the IF filter 52 has a resolution bandwidth which is normally on the order of several MHz, it is a simple matter to omit the switch SW5 and to use a single filter 55 having a pass band of 0.4 GHz as shown in FIG. 2 to allow a first intermediate frequency $F_{i1}$ and a second intermediate frequency $F_{i2}$ to pass by choosing the first intermediate frequency $F_{i1}$ to be 0.4 GHz and choosing the second intermediate frequency $F_{i2}$ to be 0.4 GHz−0.01 GHz=0.39 GHz. In other words, the band-pass filter 55*a*, 44*b* and the change-over switch SW5 shown in FIG. 10 will be replaced by the single band-pass filter 55, thus reducing the number of circuit parts.

Figures 20, 21:
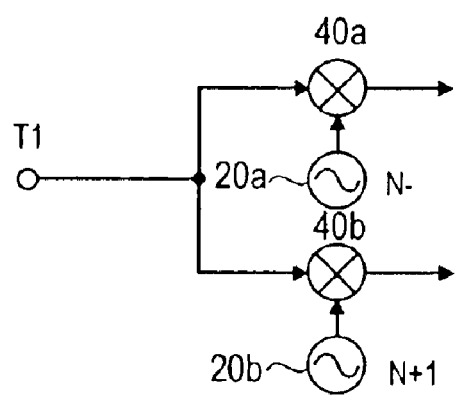
FIG. 20 is a chart showing an example of dividing into and alternately performing an N--mode sweep and an N+-mode sweep.
FIG. 21 is a diagram showing an exemplary arrangement of a mixer which performs the N--mode sweep and the N+-mode sweep simultaneously.

In the foregoing description, during the N--mode, $F1+F_i \sim F2+F_i$ is frequency swept to obtain first measured data $D_{11}$, $D_{12}$, . . . , $D_{1W}$ and during the N+-mode, $F1-F_i \sim F2-F_i$ is frequency swept to obtain second measured data $D_{21}$, $D_{22}$, . . . , $D_{2W}$. However, $F1+F_i \sim F2+F_i$ or $F1-F_i \sim F2-F_i$ need not be selectively swept. In other words, these bands $F1+F_i \sim F2+F_i$ and $F1-F_i \sim F2-F_i$ may be divided into a plurality of bands, respectively, and the divided bands may be frequency swept successively or in an appropriate order in an alternate fashion. In extreme cases, the division may be made in the interval between measured frequency points, and the sweep signal for these frequencies may alternately act upon the mixer 40. In other words, as illustrated in FIG. 20 by way of example, the frequency of a signal which acts as a local signal (sweep signal) in the mixer 40 may be chosen to be $F1+F_i$ to determine measured data $D_{11}$ and the frequency is then changed to $F1-F_i$ to determine measured data $D_{21}$, and subsequently the frequency is changed to $F1+F_i+\Delta f$ (where $\Delta f$ represents a spacing between adjacent measured frequencies) to determine measured data $D_{12}$, and then changed to $F1-F_i+\Delta f$ to determine measured data $D_{22}$, subsequently repeating the similar process to determine first measured data $D_{1j}$ and second measured data $D_{2j}$ in an alternate fashion. Accordingly, the use of the N--mode, or the sweep of the frequency of the sweep signal (local signal) which acts to produce an intended intermediate frequency by adding $F_i$ to F1 to determine first measured data is not limited to an instance in which the first measured data at measured frequency points are consecutively obtained, but may be used in determining every first measured data at each measured frequency point within the range of set-up frequencies. Similarly the N+-mode is used to determine second measured data.

As shown in FIG. 21, mixers 40*a* and 40*b* and sweep oscillators 20*a* and 20*b* are provided. A sweep signal from the sweep oscillator 20*a* is fed to the mixer 40*a* while a sweep signal from the sweep oscillator 20*b* is fed to the mixer 40*b*. By using an arrangement in which the frequency of the sweep signal from the sweep oscillator 20a acts in the mixer 40a as the frequency of a local signal which produces an intended intermediate frequency during the N−-mode while the frequency of the sweep signal from the sweep oscillator 20b acts in the mixer 40b as the frequency of a local signal which produces an intended intermediate frequency during the N+-mode, first measured data and second measured data can be obtained simultaneously. Output signals from the sweep oscillators 20a and 20b may be fed to the mixers 40a and 40b through frequency multipliers. The mixers 40a and 40b may each be a harmonic wave mixer in the similar manner as the mixer 40.

Figure 22:
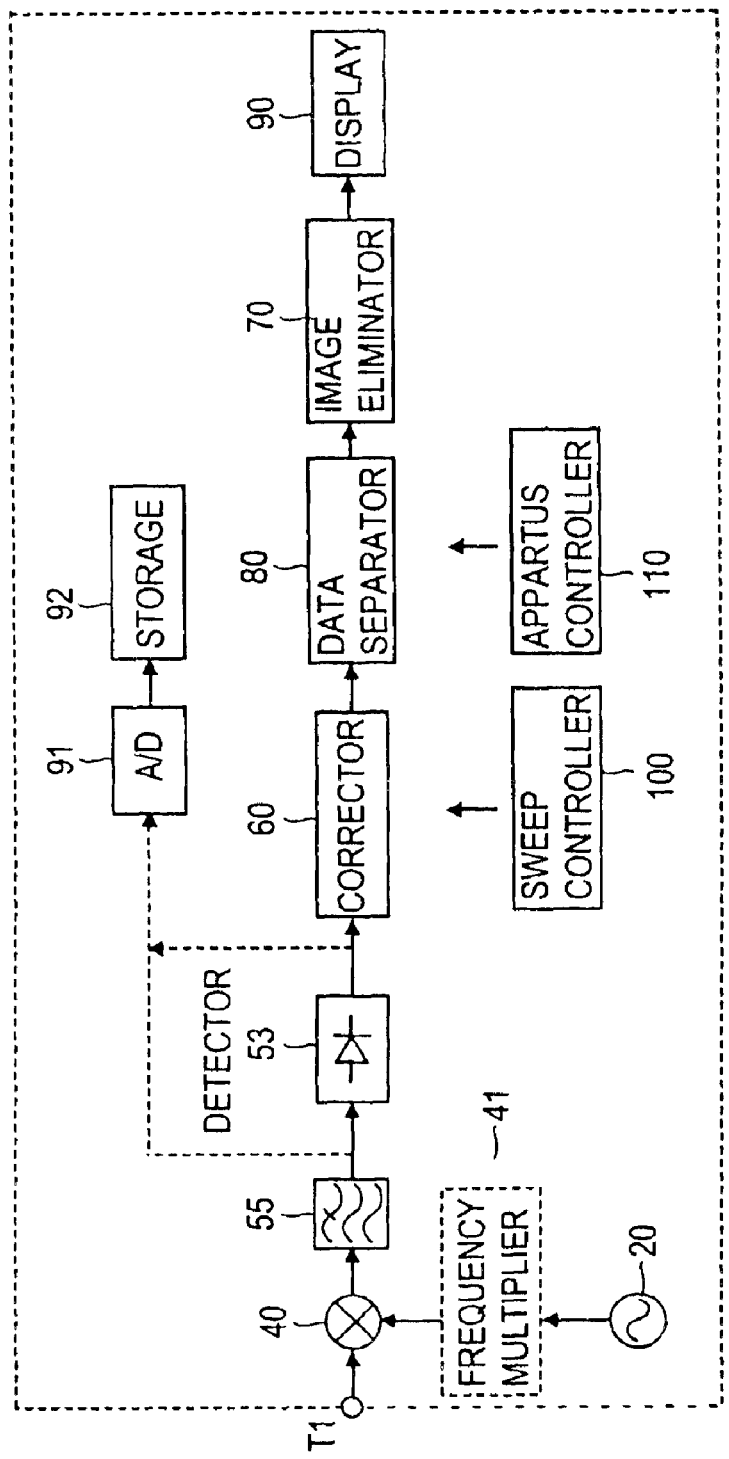
FIG. 22 is a diagram showing an exemplary arrangement of a measuring apparatus in which a frequency sweep signal is used for conversion into an intermediate frequency and in which the method according to the present invention is applied.

The method according to the present invention is applicable, not only to a spectrum analyzer, but also to a measuring apparatus such as a spurious measuring apparatus in which a signal being measured is converted into a signal of an intermediate frequency by means of a frequency sweep signal to determine measured data. As shown in FIG. 22 by way of example, the present invention is applicable to a measuring apparatus in which a signal being measured is fed from an input terminal T1 to a mixer 40, where the signal being measured is converted into a signal having an intermediate frequency by means of a sweep signal from a sweep oscillator 20, and the intermediate frequency signal is derived by a band-pass filter 55 to be detected by a detector 53 to obtain measured data, and the measured data is processed as required to provide an intended measured output.

An apparatus controller 110 and a sweep controller 100 operate to control such that an N−-mode sweep and an N+-mode sweep take place upon a signal being measured for each of a plurality of intermediate frequencies to determine measured data or a collective mode sweep is effected to determine measured data, and the measured data is separated into first and second measured data in a data separator 80, and the correction of the measured data for the mixer loss takes place as required in a corrector 60, and an image eliminator 70 applies an image elimination processing, and data which has been subjected to the image elimination processing or data which is further processed depending on the measuring apparatus is displayed by a display 90. The mixer 40 may comprise a harmonic wave mixer, or an output sweep signal from the sweep oscillator 20 may be frequency multiplied in a frequency multiplier 41 before it is fed to the mixer 40. As shown in broken lines, an output from the band-pass filter 55 or the detector 53 may be converted into digital data in an AD converter 91, and the digital data may be stored in a memory 92 such as a flexible magnetic disc, a magnetic tape, a semiconductor memory or the like. By reading stored data from the memory 92 and applying a correction of the data in the corrector 60 as required, the image elimination processing may be applied to the data before it is displayed on a display. In other words, a simple apparatus including the mixer 40, the sweep oscillator 20, the band-pass filter 55, the AD converter 91, the memory 92 and the controllers therefor may be carried to a desired location of a source of a signal being measured. After data relating to the signal being measured has been acquired, the apparatus may be carried home to apply the image elimination processing to obtain required measured data. The measured data can be displayed not only by CRT display or a liquid crystal display, but may also be recorded and displayed on and by a recording paper.

An output signal from the low pass filter 42 shown in FIG. 7 or an output signal from the mixer 56 shown in FIG. 10 may be converted into digital data, which may be processed by DSP (Degital Signal Processor) to serve subsequent various functions.

The method of the present invention mentioned above, namely, the control of the N−-mode sweep and the N+-mode sweep, the collective mode sweep, the image elimination processing, the data separation, the correction for the mixer loss and the like can be performed on a computer by the execution of a program. In this instance, the frequency conversion sweeping and measuring program can be downloaded into the computer for purpose of execution from CD-ROM, flexible magnetic disc or through a communication channel.

As described above, according to the present invention, data which is based on image signals can be suppressed by applying the image elimination processing to measured data obtained by performing the N−-mode sweep and the N+-mode sweep for a plurality of intermediate frequencies or to data which has been separated from measured data obtained by the collective mode sweep. In addition, image data which results from signals located outside a range of set-up measured frequencies can also be suppressed, avoiding the need for preselectors which are provided to avoid the occurrence of image signals and thus providing an inexpensive and simple arrangement.

What is claimed is:

1. In a method in which a signal being measured is converted in a mixer into an intermediate frequency signal having an intermediate frequency $F_i$ by means of a frequency sweep signal, a method of measurement by sweeping frequency conversion characterized by a first measuring step of using a sweep signal having a frequency which is equal to a frequency in a range of set-up frequencies added with the $F_i$ to determine measured data;

a second measuring step of using a sweep signal having a frequency which is equal to the frequency in the range of set-up frequencies from which the $F_i$ is subtracted to determine measured data;

there being M intermediate frequencies $F_i$ where M is an integer equal to or greater than 2;

performing the first measuring step for each intermediate frequency $F_i$;

performing the second measuring step for each intermediate frequency $F_i$;

and applying an image elimination processing to the M items of measured data obtained during the first measuring step which is repeated M times and M items of measured data obtained during the second measuring step which is repeated M times by determining data all having an equal value and data having a minimum value for a same measured frequency point.

2. In a method in which a signal being measured is converted in a mixer into an intermediate frequency signal having an intermediate frequency $F_i$ by means of a frequency sweep signal, a method of measurement by sweeping frequency conversion characterized by a first measuring step of using a sweep signal having a frequency which is equal to a frequency in a range of set-up frequencies added with the $F_i$ to determine measured data;

a second measuring step of using a sweep signal having a frequency which is equal to a frequency in the range of set-up frequencies from which the $F_i$ is subtracted to determine measured data;

there being M intermediate frequencies $F_i$ where M is an integer equal to or greater than 2;

performing the first measuring step for each intermediate frequency $F_i$;

performing the second measuring step for each intermediate frequency $F_i$;

and applying an image elimination processing each time either the first or the second measuring step is performed, by determining data having an equal value and data having a smaller value for each measured frequency point from the measured data obtained and immediately preceding data from which an image has been eliminated.

3. A method of measurement by sweeping frequency conversion according to claim 1 or 2 characterized in that one of the first measuring step and the second measuring step is performed for each intermediate frequency $F_i$, followed by the other measuring step.

4. In a method in which a signal being measured is converted in a mixer into an intermediate frequency signal having an intermediate frequency $F_i$ by means of a frequency sweep signal, a method of measurement by sweeping frequency conversion characterized by a first measuring step of using a sweep signal having a frequency which is equal to a frequency in a range of set-up frequencies added with the $F_i$ to determine measured data;

a second measuring step of using a sweep signal having a frequency which is equal to a frequency in the range of set-up frequencies from which the $F_i$ is subtracted to determine measured data;

there being M intermediate frequencies $F_i$ where M is an integer equal to or greater than 2;

applying an image elimination processing by performing the first measuring step and the second measuring step for each intermediate frequency $F_i$ and determining data having an equal value and data having a smaller value for both measured data obtained from the both steps;

and during the image elimination processing of an M-th intermediate frequency $F_i$, determining data having an equal value and data having a minimum value from each measured frequency point from the both measured data obtained for the M-th intermediate frequency and all of data which have previously been obtained and which have been subjected to the image elimination processing.

5. In a method in which a signal being measured is converted in a mixer into an intermediate frequency signal having an intermediate frequency $F_i$ by means of a frequency sweep signal, a method of measurement by sweeping frequency conversion characterized by there being M intermediate frequencies $F_i$ where M is an integer equal to or greater than 2;

sweeping the sweep signal, for each intermediate frequency $F_i$, between a frequency which is equal to a lower limit frequency of a range of set-up frequencies from which $F_i$ is subtracted and a frequency which is equal to an upper limit frequency of the range of set-up frequencies added with $F_i$ to obtain measured data;

separating the measured data into first measured data which is obtained by shifting the frequency by $F_i$ in the lower direction and second measured data which is obtained by shifting the frequency in the higher direction;

and applying an image elimination process by determining, for each measured frequency point, data all having an equal value and data having a minimum value from the first measured data, the second measured data and previous data which have been subjected to the image elimination processing.

6. In a method in which a signal being measured is converted in a mixer into an intermediate frequency signal having an intermediate frequency $F_i$ by means of a frequency sweep signal, a method of measurement by sweeping frequency conversion characterized by there being M intermediate frequencies $F_i$ where M is an integer equal to or greater than 2;

sweeping the sweep signal, for each intermediate frequency $F_i$, between a frequency which is equal to a lower limit frequency in a range of set-up frequencies from which $F_i$ is subtracted and a frequency which is equal to an upper limit frequency in the range of set-up frequencies added with $F_i$ to determine measured data;

after determining measured data for every intermediate frequency $F_i$, separating each measured data into first measured data which is obtained by shifting the frequency in the lower direction by the intermediate frequency $F_i$ which is used when the measured data is acquired and second measured data which is obtained by shifting the frequency in the higher direction;

and applying an image elimination processing by determining data all having an equal value and data having a minimum value, for each measured frequency point, from M items of first measured data and M items of second measured data.

7. A method of measurement by sweeping frequency conversion according to one of claims 1, 2 and 4 to 6 characterized by using a conversion loss correcting data which is previously stored to correct the measured data, and wherein the image elimination processing is applied to the corrected measured data.

8. A method of measurement by sweeping frequency conversion according to one of claims 2, 4 and 6 characterized in that after each application of the image elimination processing, a result of processing which is successively obtained or data from which the image has been eliminated subsequent to the completion of the processing is displayed.

9. A method of measurement by sweeping frequency conversion according to one of claims 1, 2 and 4 to 6 characterized in that the mixer comprises a mixer in a spectrum analyzer and the range of set-up frequencies is a range of set-up frequencies for the spectrum analyzer, whereby the data from which the image has been eliminated is obtained as a measured spectrum.

10. A method of measurement by sweeping frequency conversion according to one of claims 1, 2 and 4 characterized in that the range of set-up frequencies is divided into a plurality of sections, and the first measured data is acquired and the second measured data is acquired for each divided section.

11. A computer readable medium for causing a computer to execute the method of measurement by sweeping frequency conversion according to one of claims 1, 2, 4, 5 and 6.

* * * * *